US012362248B2

(12) United States Patent
Toshima et al.

(10) Patent No.: US 12,362,248 B2
(45) Date of Patent: Jul. 15, 2025

(54) METHOD FOR MANUFACTURING SEMICONDUCTOR DEVICE, SEMICONDUCTOR DEVICE, AND SEMICONDUCTOR MEMBER

(71) Applicant: Resonac Corporation, Tokyo (JP)

(72) Inventors: Goki Toshima, Tokyo (JP); Masaaki Takekoshi, Tokyo (JP); Keiichi Hatakeyama, Tokyo (JP)

( * ) Notice: Subject to any disclaimer, the term of this patent is extended or adjusted under 35 U.S.C. 154(b) by 0 days.

(21) Appl. No.: 18/873,329

(22) PCT Filed: Jul. 25, 2024

(86) PCT No.: PCT/JP2024/026683
§ 371 (c)(1),
(2) Date: Dec. 10, 2024

(87) PCT Pub. No.: WO2025/023308
PCT Pub. Date: Jan. 30, 2025

(65) Prior Publication Data
US 2025/0174504 A1 May 29, 2025

(30) Foreign Application Priority Data

Jul. 27, 2023 (WO) .................. PCT/JP2023/027642

(51) Int. Cl.
*H01L 23/14* (2006.01)
*H01L 23/498* (2006.01)
*H01L 23/538* (2006.01)

(52) U.S. Cl.
CPC ........ *H01L 23/14* (2013.01); *H01L 23/49816* (2013.01); *H01L 23/49827* (2013.01);
(Continued)

(58) Field of Classification Search
CPC .............. H01L 23/14; H01L 23/49816; H01L 23/49827; H01L 23/49838; H01L 23/5384;
(Continued)

(56) References Cited

U.S. PATENT DOCUMENTS

2017/0207199 A1* 7/2017 Kira ...................... H01L 25/074
2021/0098421 A1 4/2021 Wu et al.
(Continued)

FOREIGN PATENT DOCUMENTS

JP 2010-182734 8/2010
JP 2018-141105 9/2018
(Continued)

OTHER PUBLICATIONS

International Search Report dated Oct. 1, 2024 for PCT/JP2024/026683 and its English Translation.
(Continued)

*Primary Examiner* — Zandra V Smith
*Assistant Examiner* — John M Parker
(74) *Attorney, Agent, or Firm* — SOEI PATENT & LAW FIRM

(57) ABSTRACT

A method for thermo-compression bonding (TCB) a bridge die 20 having a TSV 23 to a redistribution layer is disclosed. In this method, a terminal electrode 22 and an upper end 23*a* of the TSV 23 on the bridge die 20 are covered with a thermosetting resin film (e.g. DAF) to form a resin layer 24, which is then cured. A metal collet C that sucks the bridge die 20 is heated, and the heat is transferred to the entire surface 24*a* of the resin layer 24 while applying pressure,
(Continued)

thereby heat-bonding a lower end 23b of the TSV 23 to the wiring electrode of the redistribution layer. According to this method, the amount of heat transferred to a bonded portion between the lower end 23b and the wiring electrode increases. The pressure during heat-bonding is applied to the entire surface of the resin layer 24. Thermo-compression is performed reliably.

26 Claims, 9 Drawing Sheets

(52) U.S. Cl.
CPC .... *H01L 23/49838* (2013.01); *H01L 23/5384* (2013.01); *H01L 23/5386* (2013.01)

(58) Field of Classification Search
CPC ....... H01L 23/5386; H01L 2224/73204; H01L 25/0657
See application file for complete search history.

(56) References Cited

U.S. PATENT DOCUMENTS

| 2021/0143116 A1* | 5/2021 | Hong ................ H01L 25/0657 |
| 2022/0093526 A1 | 3/2022 | Wu et al. |
| 2024/0096836 A1* | 3/2024 | Chen .................... H01L 24/83 |

FOREIGN PATENT DOCUMENTS

| JP | 2022-533048 | 7/2022 |
| JP | 2022-533574 | 7/2022 |
| KR | 10-2016-0108196 | 9/2016 |
| KR | 10-2021-0010806 | 1/2021 |
| KR | 10-2022-0152208 | 11/2022 |

OTHER PUBLICATIONS

International Search Report dated Oct. 10, 2023 for PCT/JP2023/027642 and its English Translation.

* cited by examiner (a)

(b)

(c)

(d)

(a)

(b)

(a)

(b)

METHOD FOR MANUFACTURING SEMICONDUCTOR DEVICE, SEMICONDUCTOR DEVICE, AND SEMICONDUCTOR MEMBER

CROSS-REFERENCE TO RELATED APPLICATIONS

This application is a 35 U.S.C. § 371 national phase application of PCT Application No. PCT/JP2024/026683, filed on Jul. 25, 2024, which claims the benefit of priority from PCT Patent Application No. PCT/JP2023/027642, filed on Jul. 27, 2023.

TECHNICAL FIELD

The present disclosure relates to a method for manufacturing a semiconductor device, a semiconductor device, and a semiconductor member.

BACKGROUND ART

In recent years, with a rapid increase in functionality of electronic devices such as AI/HPC, semiconductor packages are rapidly becoming larger and denser. The package structure is not limited to surface mounting with high density, but package structures and mounting processes are becoming more complex and diverse, including inorganic (silicon) or organic interposer (Bridge die/RDL) technology, 2.xD mounting using the same, and 3D mounting (HBM/Chiplet) technology using a TSV. For example, Resonac Corporation uses its Packaging Solution Center as its main base to develop next-generation semiconductor packaging process technology that combines mounting processes and materials from the perspective of customers (semiconductor manufacturers).

As a technology in the field of semiconductor packaging, Patent Literature 1 discloses a method for manufacturing a semiconductor device in which a semiconductor die with a through electrode is mounted on a carrier and encapsulated and a wiring layer is formed on the encapsulating layer and another semiconductor die is mounted on the wiring layer. Patent Literature 2 discloses another method for manufacturing a semiconductor device.

CITATION LIST

Patent Literature

Patent Literature 1: Specification of U.S. Patent Application Publication No. 2021/0098421
Patent Literature 2: Specification of U.S. Patent Application Publication No. 2022/0093526

SUMMARY OF INVENTION

Technical Problem

In the manufacturing method described in Patent Literature 1, in addition to the through electrode, a plurality of terminal electrodes for connection to the wiring layer on the encapsulating layer may be provided on the upper surface of the semiconductor die. In this case, as shown in (a) and (b) in FIG. 9, it is conceivable that a semiconductor die 120 sucked by a collet C1 is mounted on a support 110 and then pressure is applied while heating the semiconductor die 120 with the metal collet C1, which also functions as a heating element, so that a lower end 123b of a through electrode 123 of the semiconductor die 120 is heat-bonded to the wiring electrode of the support 110. However, in order to avoid contact with a plurality of terminal electrodes 122 and the like, a region R where the collet C1 is in contact with the semiconductor die 120 is limited to the outer periphery. Therefore, the heat of the collet C1 may not be sufficiently transferred to the semiconductor die 120 and the through electrode 123 (bonding portion) located thereinside. In addition, since the load from the collet C1 is applied only to the outer periphery of the semiconductor die 120, there is a concern that the bonding pressure of the through electrode 123 to the wiring electrode of the support 110 may not be sufficiently secured. For the above reasons, in the method shown in (a) and (b) in FIG. 9, there is a concern that the lower end 123b of the through electrode 123 of the semiconductor die 120 having a plurality of terminal electrodes 122 may not be able to be reliably thermo-compressed to the wiring electrode.

It is an object of the present disclosure to provide a method for manufacturing a semiconductor device capable of reliably bonding a through electrode of a semiconductor member (semiconductor die).

Solution to Problem

[1] An aspect of the present disclosure relates to a method for manufacturing a semiconductor device. This manufacturing method includes: preparing a semiconductor member including a semiconductor substrate having a first surface and a second surface on an opposite side, a plurality of terminal electrodes provided on the first surface of the semiconductor substrate, a through electrode that penetrates the semiconductor substrate and has a first end protruding from the first surface and a second end protruding from the second surface, and a cured resin layer provided on the first surface so as to cover the plurality of terminal electrodes and the first end of the through electrode; preparing a support including at least one wiring electrode; arranging the semiconductor member on the support so that the second end of the through electrode of the semiconductor member corresponds to the wiring electrode of the support; and heat-bonding the second end of the through electrode and the wiring electrode of the support to each other by pressing a surface of the cured resin layer of the semiconductor member while making the heating element in contact with the surface of the cured resin layer.

In this method for manufacturing a semiconductor device, the cured resin layer is provided on the first surface of the semiconductor device so as to cover the plurality of terminal electrodes and the first end of the through electrode. Then, the heating element is pressed against the surface of the cured resin layer while making the heating element in contact with the surface of the cured resin layer, thereby heat-bonding the second end of the through electrode and the wiring electrode of the support to each other. In this case, since the plurality of terminal electrodes and the first end of the through electrode are covered with the resin layer, the semiconductor member can be heated by the heating element without avoiding the terminal electrodes and the like. Therefore, heat from the heating element can be sufficiently transferred to the semiconductor member and the through electrodes located thereinside. In addition, since a load can be applied to the entire surface of the semiconductor die by providing such a resin layer, the bonding pressure of the through electrode to the wiring electrode of the support can be sufficiently secured. As described above, according to this method for manufacturing a semiconductor device, it is possible to reliably bond the through electrode of the semiconductor die having a plurality of terminal electrodes. In addition, it is sufficient that the "cured resin layer" referred to herein is cured to such an extent that the pressure from the heating element is transmitted or the cured resin layer does not adhere to the heating element that comes into contact therewith. Therefore, the "cured resin layer" may not be completely cured (so-called C stage).

In addition, in this method for manufacturing a semiconductor device, the cured resin layer is provided on the first surface of the semiconductor device so as to cover the plurality of terminal electrodes and the first end of the through electrode. Then, the surface of the cured resin layer is adsorbed and lifted up, and subsequent semiconductor member arrangement and the like are performed. In this case, since the plurality of terminal electrodes and the like are covered with the resin layer, the semiconductor member can be lifted up by suction using a holding member or the like without avoiding the terminal electrodes and the like. Therefore, bending or cracking of the semiconductor member (semiconductor die) can be prevented. In addition, since the plurality of terminal electrodes and the like are covered with the resin layer, the semiconductor member can be reliably attached to the support by applying a load to the entire semiconductor member in the planar direction when attaching the semiconductor member to the support. As described above, according to this method for manufacturing a semiconductor device, the semiconductor member can be attached reliably. In addition, in this method for manufacturing a semiconductor device manufacturing method, since a portion covering the terminal electrodes and the like is formed from the cured resin layer, the manufacturing process is easy. In addition, it is sufficient that the "cured resin layer" referred to herein is cured to such an extent that at least one of adhesion and application of a load is possible. Therefore, the "cured resin layer" may not be completely cured (so-called C stage).

[2] In the method for manufacturing a semiconductor device according to [1] described above, the preparing the semiconductor member may include forming a resin layer including a curable resin composition on the first surface of the semiconductor substrate so as to cover the plurality of terminal electrodes and the first end of the through electrode, and curing the resin layer to obtain the cured resin layer. In this case, it is possible to easily form the resin layer that protects the plurality of terminal electrodes and the first end of the through electrode.

[3] In the method for manufacturing a semiconductor device according to [1] or [2] described above, it is preferable that the cured resin layer is formed by attaching a resin film including a curable resin composition to the first surface of the semiconductor substrate and then curing the resin film. In this case, it is possible to easily form the resin layer that protects the plurality of terminal electrodes and the first end of the through electrode.

[4] In the method for manufacturing a semiconductor device according to [1] or [2] described above, the cured resin layer may be formed by applying a liquid adhesive including a curable resin composition to the first surface of the semiconductor substrate and then curing the liquid adhesive. In this case, it is possible to easily form the resin layer that protects the plurality of terminal electrodes and the first end of the through electrode.

[5] In the method for manufacturing a semiconductor device according to any one of [1] to [4] described above, it is preferable that the cured resin layer contains inorganic fillers. In this case, since the hardness (elastic modulus and the like) of the resin layer can be improved, bending and cracking of the semiconductor member can be further prevented. In addition, since the inorganic fillers are included, it is also possible to prevent the warpage of the semiconductor member including the resin layer. Further, by adjusting the shape (aspect ratio) of the inorganic fillers or the content of the inorganic fillers, it is possible to adjust the heat transferred from the heating element to the lower end of the through electrode to a desired value.

[6] In the method for manufacturing a semiconductor device according to [5] described above, the content of the inorganic fillers in the cured resin layer may be 30% by mass or more with a total amount of solids included in a resin layer before curing as a reference. In this case, the warpage of the semiconductor member can be more reliably prevented.

[7] In the method for manufacturing a semiconductor device according to [5] or [6] described above, it is preferable that an average particle size of the inorganic fillers in the cured resin layer is 20 μm or less. In this case, even if each terminal electrode of the semiconductor member and the pitch between the terminal electrodes are small, the resin and fillers can be inserted (filled) between the terminal electrodes. Therefore, the terminal electrodes can be reliably covered with the resin layer. In addition, the warpage of the cured resin layer can be prevented.

[8] In the method for manufacturing a semiconductor device according to any one of [1] to [7] described above, an elastic modulus of the cured resin layer at room temperature may be 10 MPa or more. In this case, bending and cracking of the semiconductor member can be further prevented. In addition, when the cured resin layer is polished to expose the heads of the terminal electrodes, the polishing work can be easily performed. The elastic modulus referred to herein means Young's modulus. Room temperature means 25° C. Since the cured resin layer has a high elastic modulus, the resin layer, the copper pattern, and the like can be easily ground in the subsequent steps. As described above, the cured resin layer may not be completely cured, and may be hard enough to be polished in the polishing work.

[9] In the method for manufacturing a semiconductor device according to any one of [1] to [8] described above, it is preferable that the preparing the semiconductor member includes: preparing a semiconductor wafer including the semiconductor substrate, a plurality of through electrodes including the through electrode being provided in the semiconductor wafer and a plurality of electrodes including the plurality of terminal electrodes and each first end of the plurality of through electrodes being provided on a first surface of the semiconductor wafer; forming a wafer resin layer including a curable resin composition on the first surface of the semiconductor wafer so as to cover the plurality of electrodes and each first end of the plurality of through electrodes; curing the wafer resin layer; and singulating the semiconductor wafer into individual pieces by dicing to obtain the semiconductor member. In this case, a plurality of semiconductor members can be manufactured collectively. In addition, according to this manufacturing method, even when the semiconductor wafer is singulated into individual pieces by dicing, the semiconductor member can be peeled from the dicing tape without bending or cracking.

[10] The method for manufacturing a semiconductor device according to according to any one of [1] to [9] described above may further include forming an encapsulating layer on the support by encapsulating the semiconductor member with an encapsulation after the second end of the through electrode is bonded to the wiring electrode of the support.

[11] In the method for manufacturing a semiconductor device according to [10] above, it is preferable that an average particle size of inorganic fillers included in the encapsulating layer is larger than an average particle size of inorganic fillers included in the cured resin layer. Since the encapsulation contains large inorganic fillers, the warpage of the encapsulating layer due to heat can be reliably prevented. Particularly in the large-format process, reliable adsorption becomes possible during high-precision processing in subsequent steps.

[12] In the method for manufacturing a semiconductor device according to [10] or [11] described above, it is preferable that a difference between a linear expansion coefficient of the encapsulating layer and a linear expansion coefficient of the cured resin layer is within 150 ppm/K. In this case, since the behavior of the encapsulating layer and the resin layer becomes uniform when heat is applied to the manufactured semiconductor device, the occurrence of problems due to heat, such as misalignment due to expansion, can be reduced.

[13] The method for manufacturing a semiconductor device according to any one of [10] to [12] described above may further include polishing the cured resin layer together with the encapsulating layer so that a front end of each of the plurality of terminal electrodes and the first end of the through electrode are exposed from the cured resin layer. In this case, it is possible to accurately form a fine wiring layer and the like on the surface of the polished encapsulating layer and the like.

[14] In the method for manufacturing a semiconductor device according to any one of [1] to [13] described above, a thickness of the cured resin layer may be 15 µm or more or 30 µm or more in the arranging the semiconductor member. In this case, bending and cracking of the semiconductor member can be more reliably prevented.

[15] In the method for manufacturing a semiconductor device according to any one of [1] to [14] described above, it is preferable that a thermal conductivity of the cured resin layer is 0.3 W/m·K or more. In this case, since heat can be reliably transferred to a bonded portion between the lower end of the through electrode and the wiring electrode, the lower end of the through electrode and the wiring electrode can be reliably heat-bonded to each other.

[16] In the method for manufacturing a semiconductor device according to any one of [1] to [15] described above, an insulating auxiliary member to attach the semiconductor member to the support may be provided on the second surface of the semiconductor substrate, and the auxiliary member may surround the second end of the through electrode. In this case, the through electrode of the semiconductor member can be more reliably bonded to the wiring electrode of the support while ensuring insulation from other electrodes. In addition, the semiconductor member can be easily attached to the support.

[17] In the method for manufacturing a semiconductor device according to [16] described above, the auxiliary member may be provided on the second surface of the semiconductor member before the semiconductor member is arranged on the support. In this case, the work of attaching the semiconductor member to the support is simplified.

[18] In the method for manufacturing a semiconductor device according to [16] or [17] described above, a difference between a linear expansion coefficient of the cured resin layer and a linear expansion coefficient of the auxiliary member may be within 150 ppm/K. In this case, since the thermal expansions of the cured resin layer and the auxiliary member interposing the semiconductor substrate therebetween are approximately the same, it is possible to prevent the position or parallelism of the semiconductor substrate from being adversely affected and to prevent the warpage of the mounted chip.

[19] In the method for manufacturing a semiconductor device according to any one of [16] to [18] described above, the auxiliary member may be a non-conductive adhesive film. In this case, the auxiliary member can be easily provided.

[20] In the method for manufacturing a semiconductor device according to any one of [16] to [19] described above, a transmittance of the auxiliary member may be 10% or more. In this case, since the alignment marks formed on the semiconductor die can be checked by a camera through the auxiliary member, the semiconductor die can be accurately mounted on the support.

[21] In the method for manufacturing a semiconductor device according to any one of [1] to [20] described above, a thickness of the cured resin layer may be between 50% and 150% of a height of the plurality of terminal electrodes. In this case, since the thickness of the resin layer and the height of the terminal electrode are approximately equal, the semiconductor member can be lifted up and attached more reliably. The height of the plurality of terminal electrodes herein means the average height of the plurality of terminal electrodes.

[22] In the method for manufacturing a semiconductor device according to any one of [1] to [21] described above, it is preferable that, in the arranging the semiconductor member, a holding member is adsorbed to the entire surface of the cured resin layer and lifted up, and in the heat-bonding, the holding member is made to function as the heating element, and the holding member is brought into contact with and pressed against the entire surface of the cured resin layer to perform heat-bonding. In this case, bending or cracking of the semiconductor member can be more reliably prevented, and the through electrode of the semiconductor member can be more reliably bonded to the wiring electrode of the support. In addition, the semiconductor member can be attached to the support more reliably.

[23] In the method for manufacturing a semiconductor device according to any one of [1] to [22] described above, it is preferable that the cured resin layer has an ionic impurity concentration of 5 ppm or less. In this case, it is possible to prevent migration between the plurality of terminal electrodes covered with the cured resin layer or migration between the terminal electrodes and the first end of the through electrode.

[24] In the method for manufacturing a semiconductor device according to any one of [1] to [23] described above, a bonding strength between the cured resin layer and the first surface of the semiconductor substrate may be 1 MPa or more. In this case, in the manufactured semiconductor device, peeling of the resin layer of the semiconductor member is prevented.

[25] In the method for manufacturing a semiconductor device according to any one of [1] to [24] described above, it is preferable that a bonding strength between the cured resin layer and the first surface of the semiconductor substrate is 3 MPa or more. In this case, in the manufactured semiconductor device, peeling of the resin layer of the semiconductor member can be more reliably prevented.

[26] The method for manufacturing a semiconductor device according to any one of [1] to [25] described above may further include mounting a first semiconductor die and a second semiconductor die on the first surface side of the semiconductor member after the semiconductor member is attached to the support, and in the mounting, the first semiconductor die and the second semiconductor die may be connected to each other by the semiconductor member. In this case, the semiconductor die can function as a bridge die.

[27] Another aspect of the present disclosure relates to a semiconductor device. The semiconductor device includes a semiconductor member, and a support including at least one wiring electrode, the semiconductor member being attached to the support. The semiconductor member includes a semiconductor substrate having a first surface and a second surface on an opposite side, a plurality of terminal electrodes provided on the first surface of the semiconductor substrate, a through electrode that penetrates the semiconductor substrate and has a first end protruding from the first surface and a second end protruding from the second surface, and a cured resin layer provided on the first surface so as to cover the plurality of terminal electrodes and the first end of the through electrode. In this semiconductor device, the second end of the through electrode and the wiring electrode of the support are bonded to each other.

[28] The semiconductor device according to [27] described above may further include an insulating auxiliary member to attach the semiconductor member to the support, and the auxiliary member may surround the second end of the through electrode. In this case, insulation can be more reliably ensured in bonding between the through electrode of the semiconductor member and the wiring electrode of the support.

[29] The semiconductor device according to [27] or [28] described above may further include an encapsulating layer that encapsulates the semiconductor member.

[30] In the semiconductor device according to [29] described above, an average particle size of inorganic fillers included in the encapsulating layer may be larger than an average particle size of an inorganic fillers included in the cured resin layer. Since the encapsulating layer contains large inorganic fillers, the warpage of the encapsulating layer due to heat can be reliably prevented.

[31] In the semiconductor device according to [29] or [30] described above, a difference between a linear expansion coefficient of the encapsulating layer and a linear expansion coefficient of the cured resin layer may be within 150 ppm/K. In this case, since the behavior of the encapsulating layer and the resin layer becomes uniform when heat is applied to the semiconductor device, the occurrence of problems due to heat, such as misalignment due to expansion, can be reduced.

[32] The semiconductor device according to any one of [27] to [31] described above may further include a first semiconductor die and a second semiconductor die provided on the first surface side of the semiconductor substrate, and at least one of the first end of the through electrode and the plurality of terminal electrodes of the semiconductor member may be connected to the first semiconductor die and the second semiconductor die.

Advantageous Effects of Invention

According to the present disclosure, it is possible to provide a method for manufacturing a semiconductor device, capable of reliably bonding the through electrode of the semiconductor member (semiconductor die).

Figure 1:
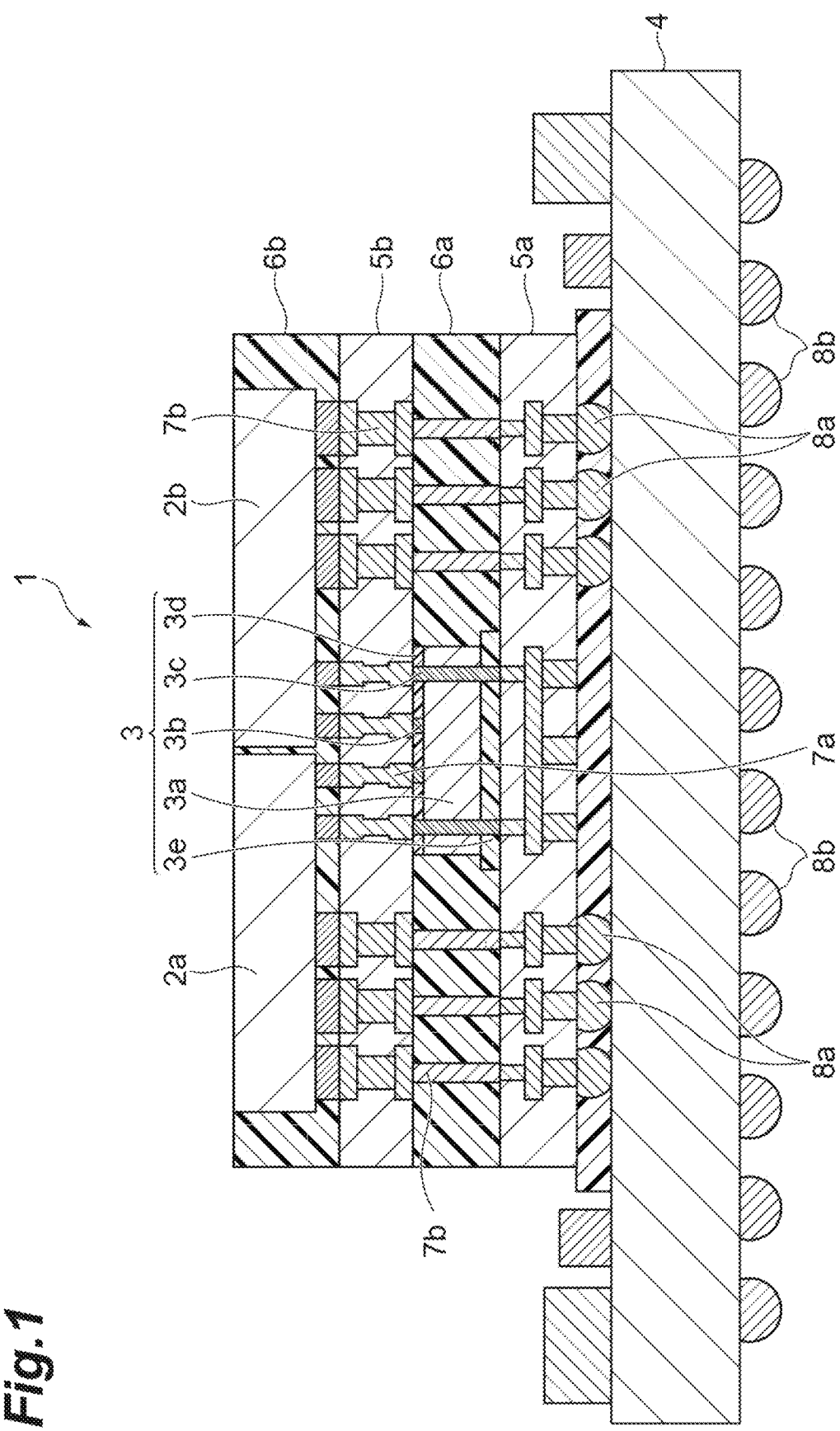
FIG. 1 is a cross-sectional view showing an example of the cross-sectional configuration of a semiconductor device according to an embodiment of the present invention.
Figure 2:
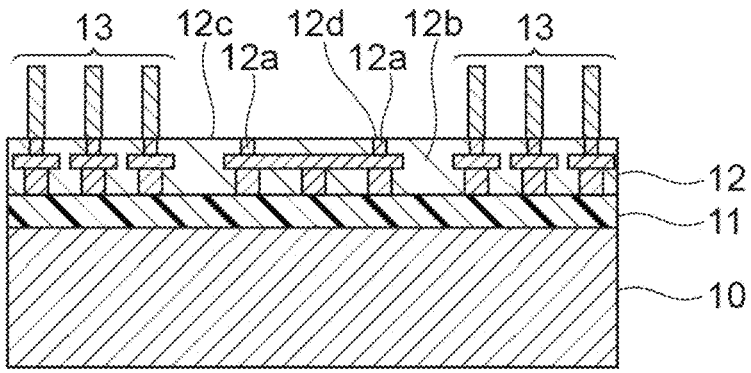
Figure 2:
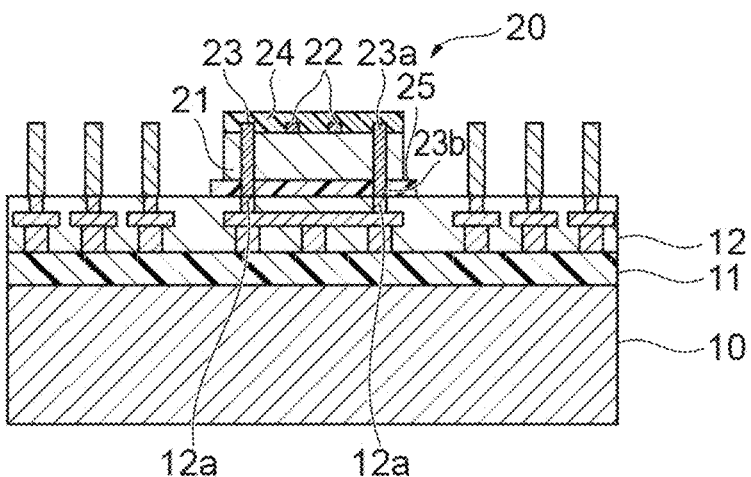
Figure 2:
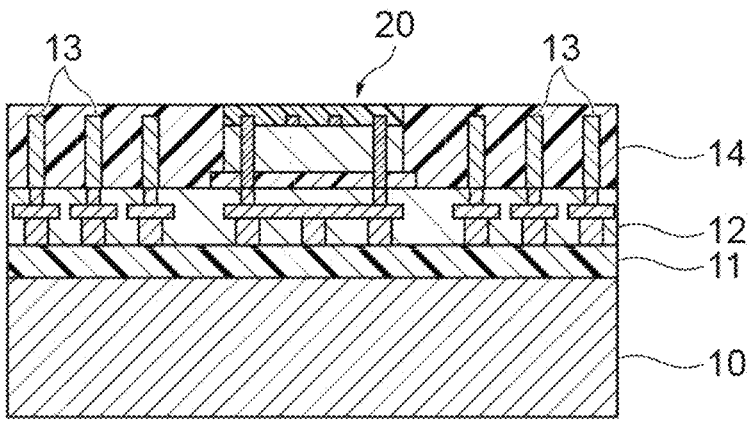
Figure 2:
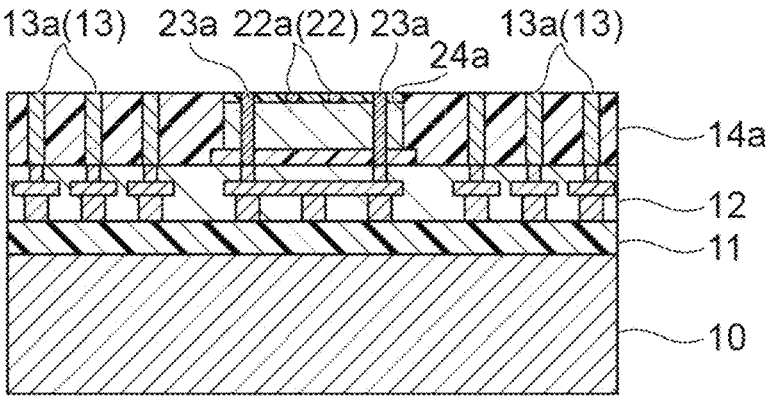

(a) to (d) in FIG. 2 are cross-sectional views showing a method for manufacturing the semiconductor device shown in FIG. 1.

Figure 3:
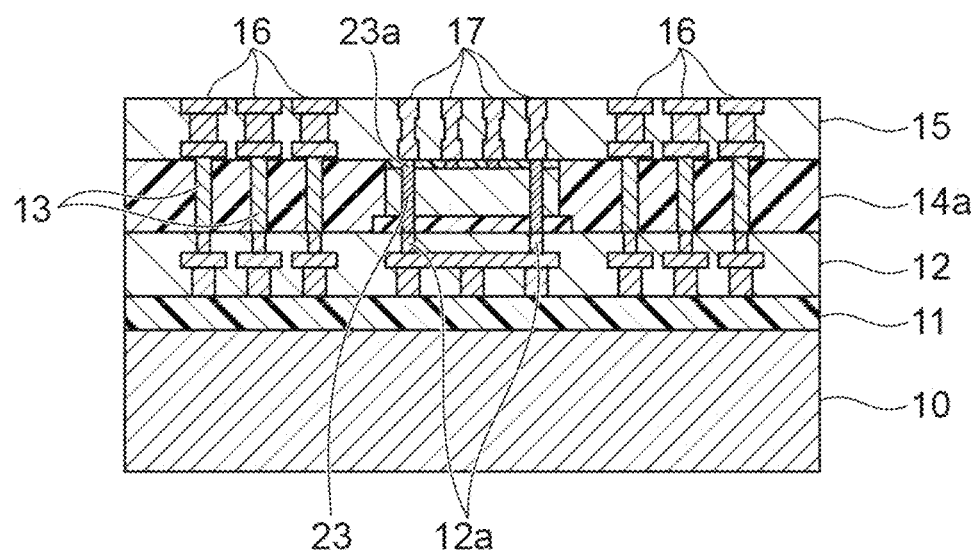
Figure 3:
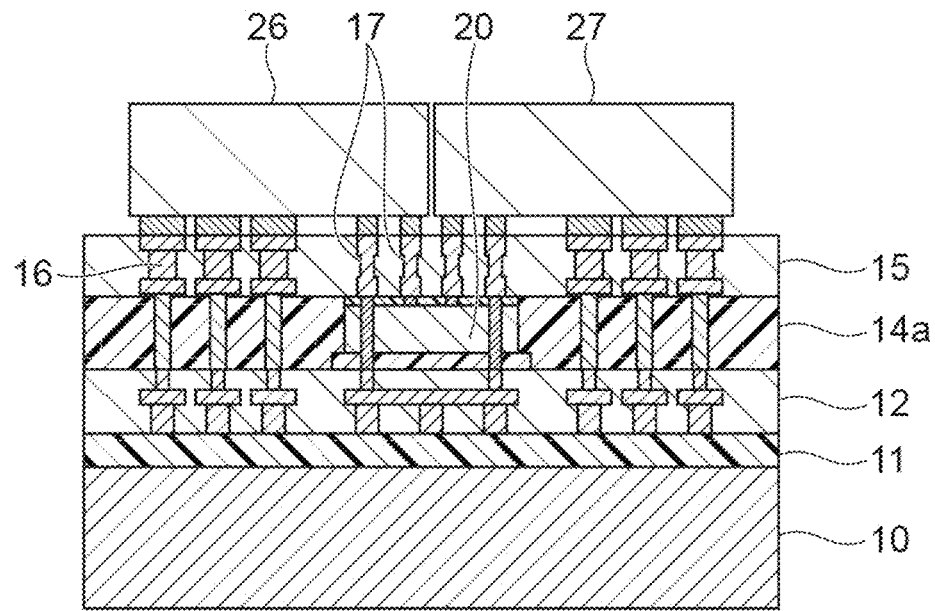

(a) and (b) in FIG. 3 are cross-sectional views showing the method for manufacturing the semiconductor device shown in FIG. 1, and show steps performed after the step shown in (d) in FIG. 2.

Figure 4:
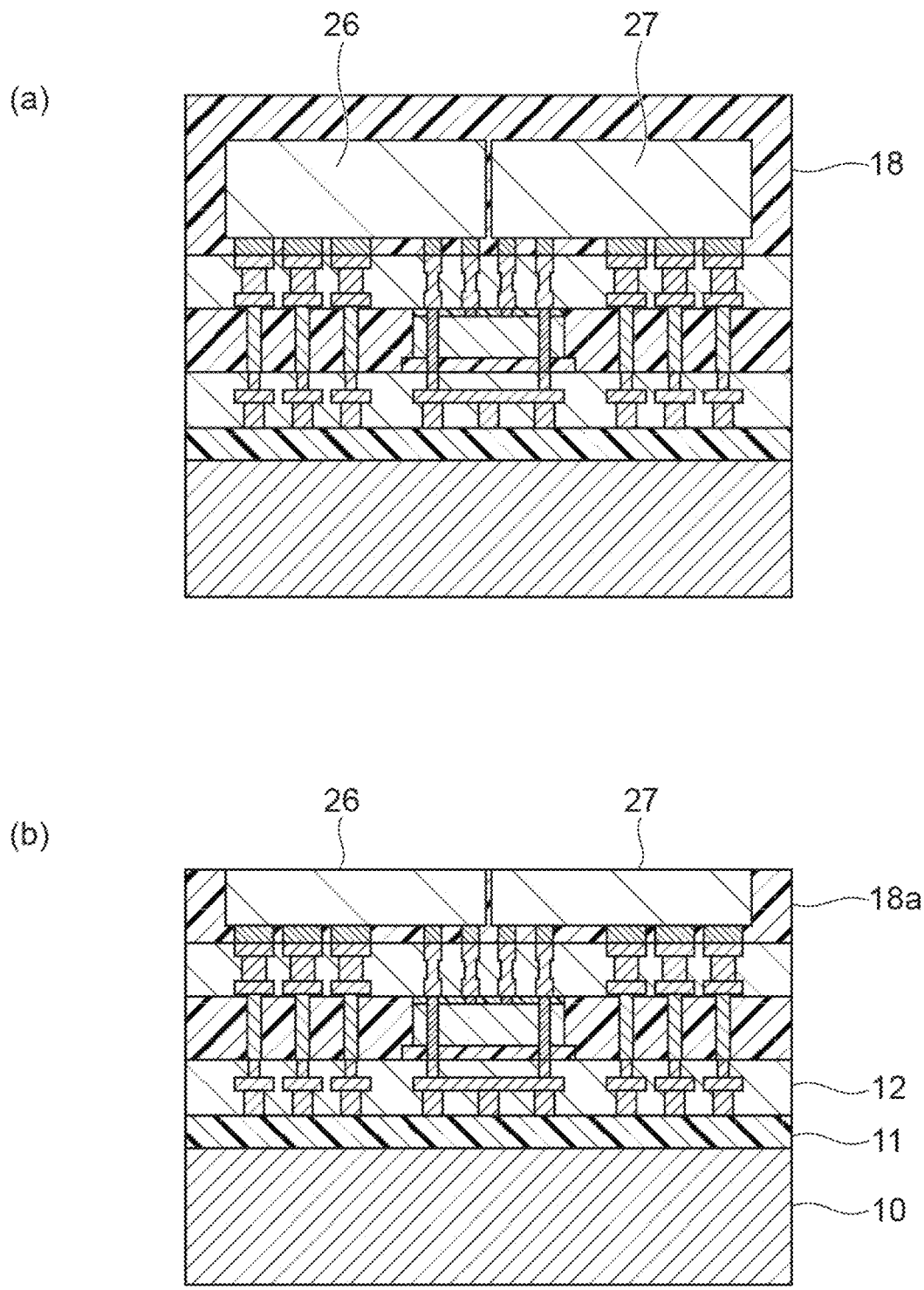

(a) and (b) in FIG. 4 are cross-sectional views showing the method for manufacturing the semiconductor device shown in FIG. 1, and show steps performed after the step shown in (b) in FIG. 3.

Figure 5:
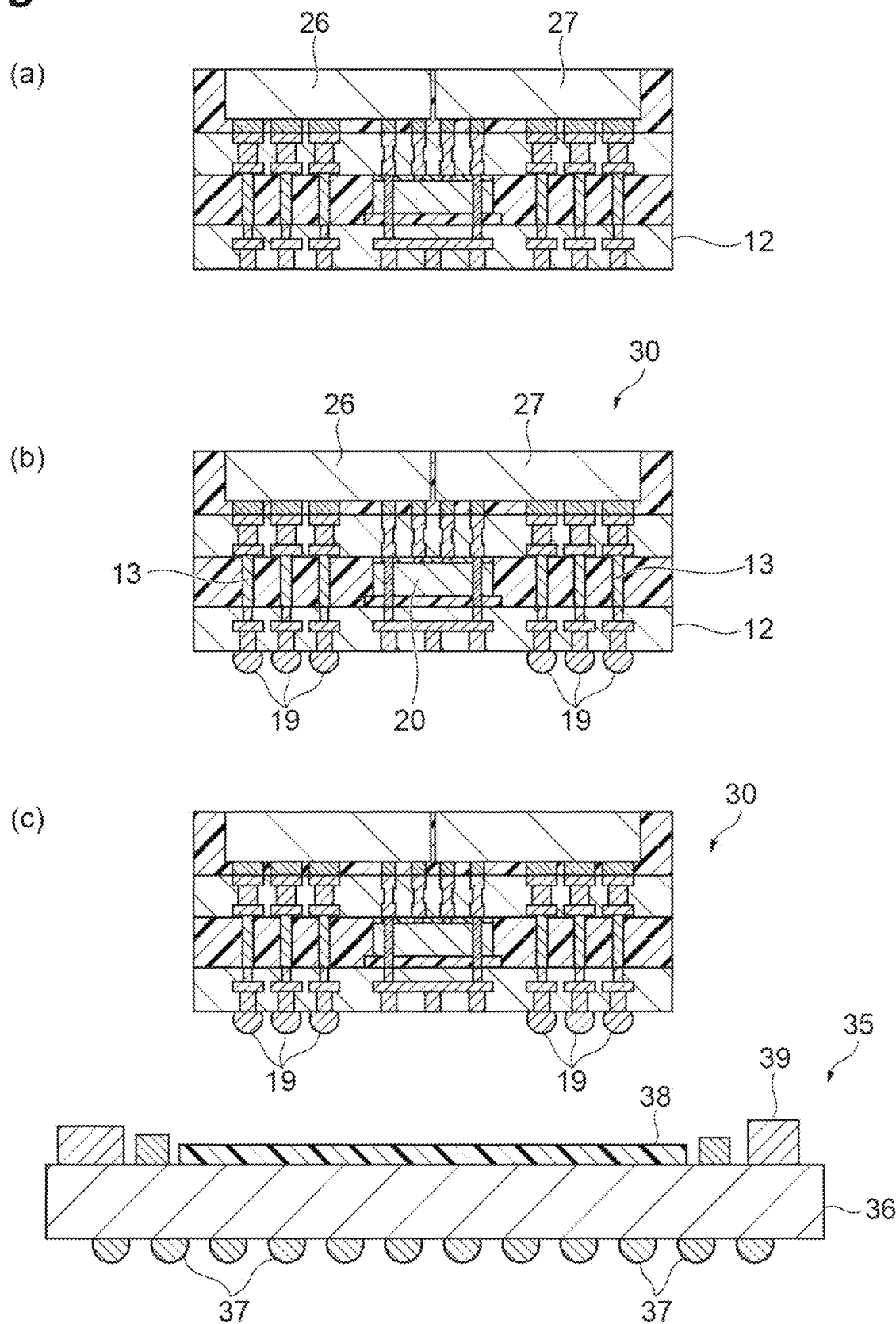

(a) to (c) in FIG. 5 are cross-sectional views showing the method for manufacturing the semiconductor device shown in FIG. 1, and show steps performed after the step shown in (b) in FIG. 4.

Figure 6:
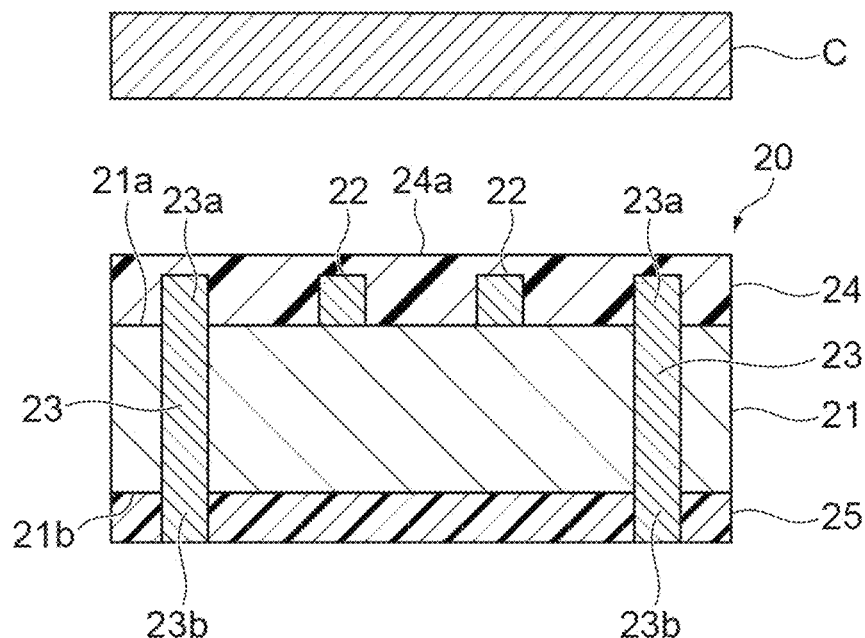
Figure 6:
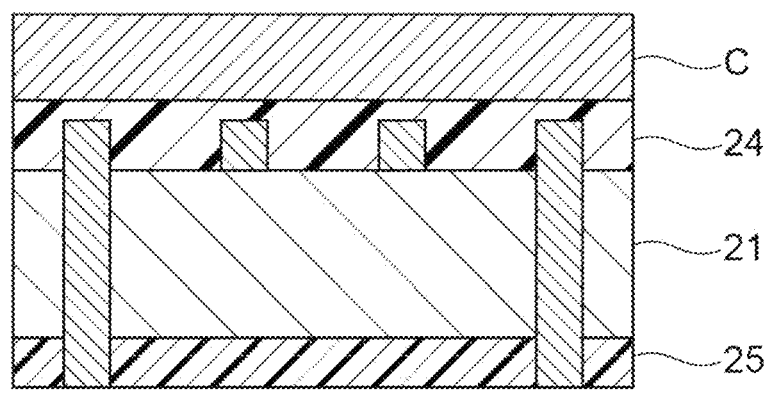

(a) and (b) in FIG. 6 are drawings for explaining steps of picking up a bridge die with a collet and performing thermocompression.

Figure 7:
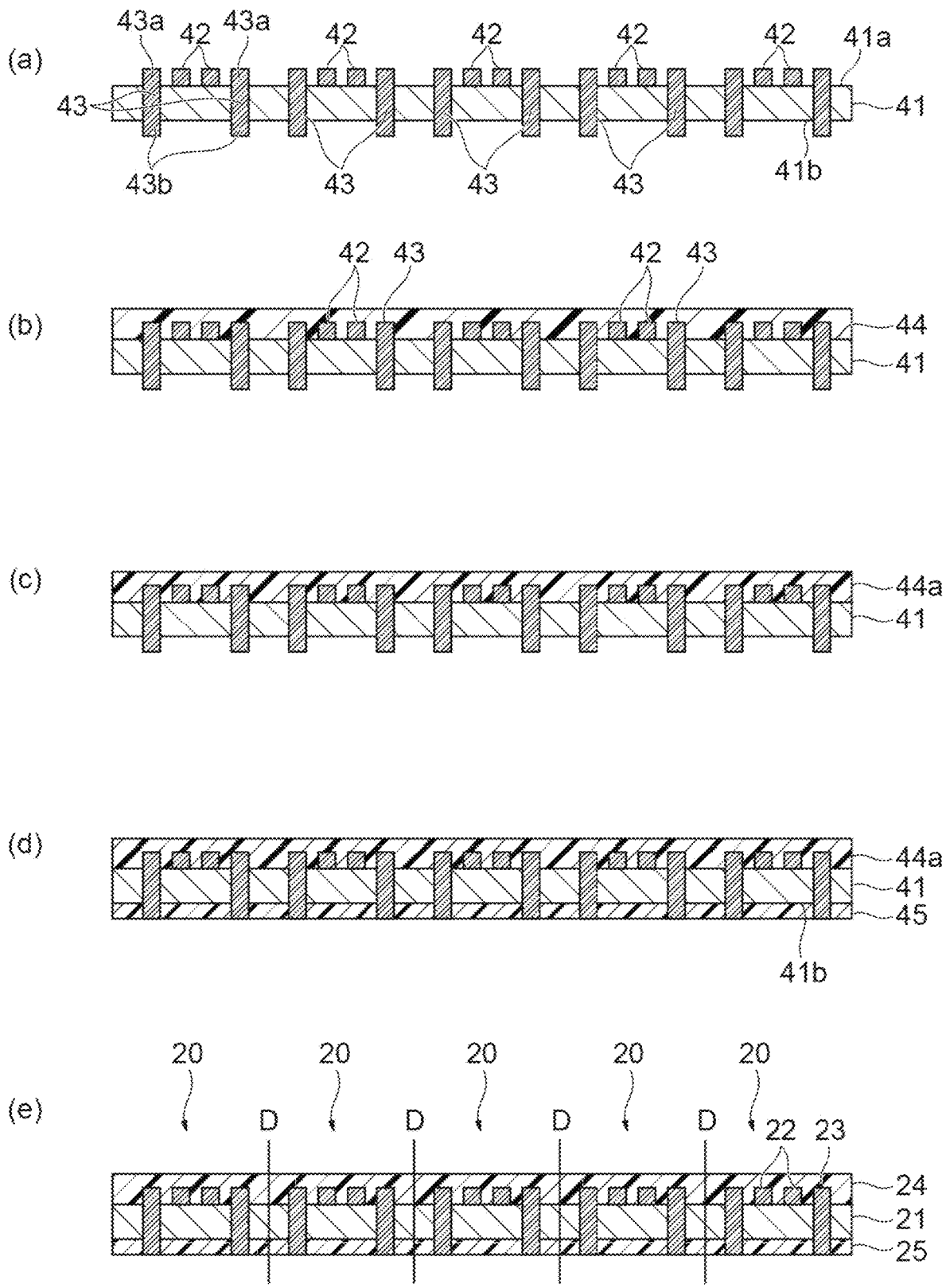

(a) to (e) in FIG. 7 are cross-sectional views showing a method for collectively manufacturing a plurality of bridge dies using a semiconductor wafer.

Figure 8:
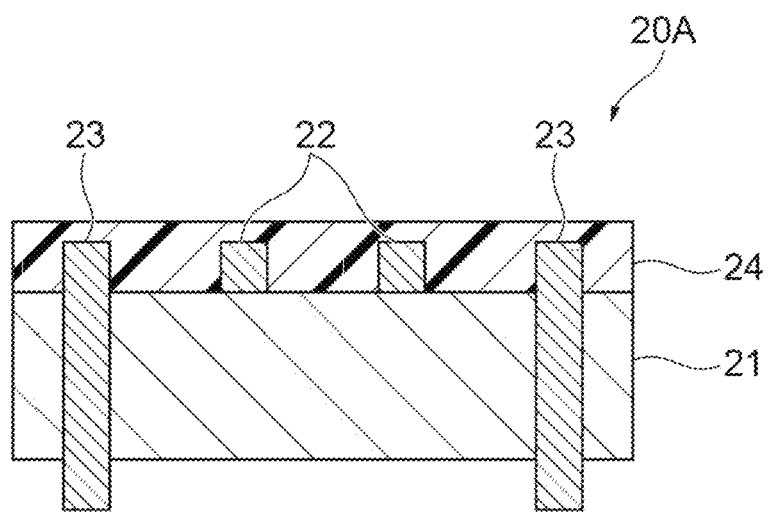

FIG. 8 is a cross-sectional view showing a bridge die according to a modification example.

Figure 9:
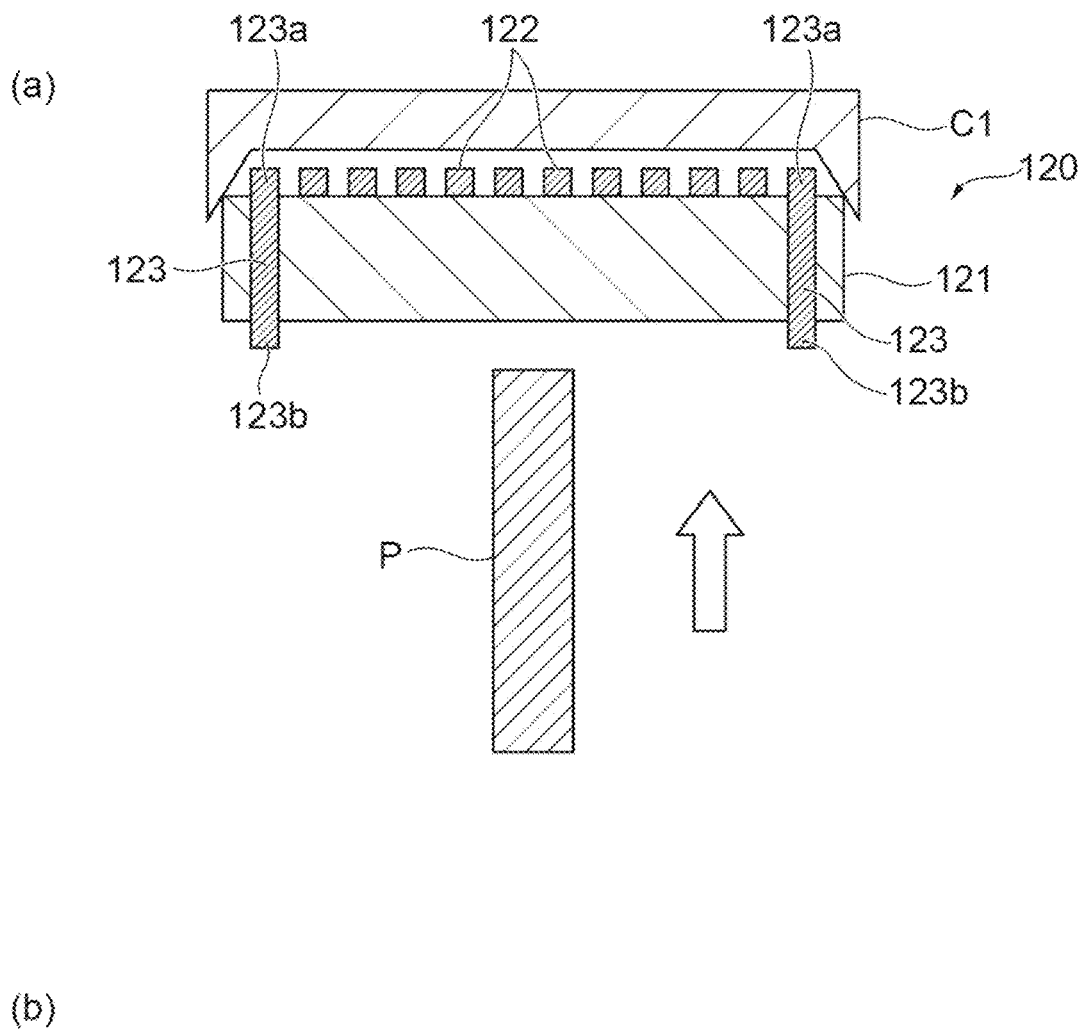
Figure 9:
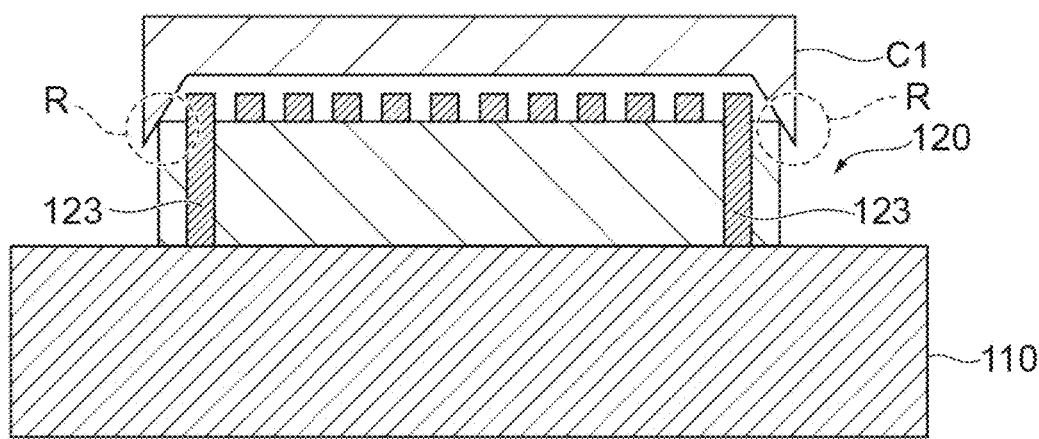

(a) and (b) in FIG. 9 are drawings for explaining steps of picking up a bridge die with a collet and performing thermocompression in a conventional method.

DESCRIPTION OF EMBODIMENTS

Hereinafter, embodiments of the present invention will be described in detail with reference to the drawings. In the following description, the same or equivalent portions are denoted by the same reference numerals, and repeated descriptions thereof will be omitted. It is assumed that the positional relationship such as up, down, left, and right is based on the positional relationship shown in the drawings unless otherwise specified. The dimensional ratio of each drawing is not limited to the ratio shown in the drawing.

In this specification, the term "layer" includes not only a structure having a shape formed on the entire surface but also a structure having a shape partially formed when observed as a plan view. In this specification, the term "step" includes not only an independent step but also a step whose intended effect is achieved even if the step cannot be clearly distinguished from other steps.

In this specification, the numerical range indicated by using "to" indicates a range including the numerical values before and after "to" as the minimum and maximum values, respectively. In the numerical ranges described stepwise in this specification, the upper limit value or lower limit value of the numerical range at one stage may be replaced with the upper limit value or lower limit value of the numerical range at another stage. In the numerical ranges described in this specification, the upper limit value or lower limit value of each numerical range may be replaced with the values shown in the examples.

FIG. 1 is a drawing showing an example of a semiconductor device manufactured by using a manufacturing method according to an embodiment of the present invention. As shown in FIG. 1, a semiconductor device 1 includes semiconductor dies 2a and 2b, a semiconductor die 3, a substrate 4, wiring layers 5a and 5b, encapsulating layers 6a and 6b, connection electrodes 7a and 7b, and bumps 8a and 8b. The semiconductor dies 2a and 2b (first semiconductor die, second semiconductor die) are, for example, semiconductor chips such as an LSI chip, a CMOS sensor, and a memory. The semiconductor die 3 is, for example, a bridge die or a silicon capacitor, and connects the semiconductor die 2a and the semiconductor die 2b to each other through the connection electrode 7a. In the semiconductor device 1, the wiring layer 5a including parts (lower portion) of the connection electrodes 7b, the encapsulating layer 6a that encapsulates the semiconductor die 3, the wiring layer 5b including parts (upper portion) of the connection electrodes 7b and the connection electrodes 7a, and the encapsulating layer 6b that encapsulates the semiconductor dies 2a and 2b are stacked in this order on the substrate 4. The connection electrodes 7b are connected to the substrate 4 through a plurality of bumps 8a. A plurality of other bumps 8b for connection to an external device are further provided on the substrate 4.

In this semiconductor device 1, the semiconductor die 3 is provided in the encapsulating layer 6a in a face-up state. The semiconductor die 3 has a semiconductor substrate 3a, a plurality of terminal electrodes 3b provided on an upper surface (first surface) of the semiconductor substrate 3a, through electrodes 3c that each penetrate the semiconductor substrate 3a and have upper ends (first ends) and lower ends (second ends) protruding from the upper surface (first surface) and a lower surface (second surface) of the semiconductor substrate 3a, a resin layer 3d formed on the upper surface of the semiconductor substrate 3a so as to cover the plurality of terminal electrodes 3b and the upper ends of the through electrodes 3c, and an auxiliary member 3e provided on the lower surface of the semiconductor substrate 3a. The resin layer 3d is a resin film containing a thermosetting adhesive, such as a die attach film (DAF), or a liquid thermosetting adhesive, and is a cured resin layer obtained by heat-curing either of these. That is, the material forming the resin layer 3d is in a semi-cured (B stage) state and then in a completely cured (C stage) state through a subsequent curing process. However, the resin layer 3d may be in a cured state that is not completely cured, as long as the semiconductor device 1 is not adversely affected. The curable resin composition forming the resin layer 3d contains a thermosetting resin, and may contain, for example, at least one resin selected from the group including an epoxy resin, a bismaleimide resin, a triazine resin, and a phenol resin. The curable resin composition may further contain a curing agent, a curing accelerator, and inorganic fillers.

The front ends of the plurality of terminal electrodes 3b and the upper ends of the through electrodes 3c are exposed on the surface of the resin layer 3d. The plurality of terminal electrodes 3b and the upper ends of the through electrodes 3c are connected to the semiconductor dies 2a and 2b through the connection electrodes 7a. For example, the semiconductor die 3 that is a bridge die is an extremely thin semiconductor die. For example, the semiconductor die 3 may have a thickness of 100 µm or less, or may have a thickness of 50 µm or less. In addition, the terminal electrodes 3b of the semiconductor die 3 and the pitch therebetween are also becoming smaller. The diameter of each terminal electrode 3b is, for example, 10 µm to 50 µm, the terminal pitch (separation distance) between the terminal electrodes 3b is, for example, 5 µm to 20 µm, and the height of each terminal electrode 3b is, for example, 20 µm to 50 µm. However, the size of the terminal electrode 3b is not limited to these. The through electrode 3c includes, for example, a through-silicon via (TSV). The diameter of the through electrode 3c is, for example, 10 µm to 50 µm. The upper end of the through electrode 3c protrudes from the upper surface of the semiconductor substrate 3a and is exposed from the resin layer 3d in the same manner as the terminal electrode 3b. On the other hand, the lower end of the through electrode 3c protrudes from the lower surface of the semiconductor substrate 3a and is bonded (connected) to the wiring electrode of the wiring layer 5a.

The auxiliary member 3e is a member that extends in a planar direction so as to surround the periphery of a bonded portion between the lower end of each through electrode 3c and the wiring electrode of the wiring layer 5a so that the bonded portion is electrically insulated from other electrodes and that bonds and fixes the semiconductor die 3 to the wiring layer 5a. The auxiliary member 3e is formed of, for example, a non-conductive resin adhesive film (for example, Non Conductive Film, NCF). The curable resin composition forming the auxiliary member 3e contains a thermosetting resin having an electrical insulation property. Examples of such thermosetting resin include an epoxy resin, a bismaleimide resin, a triazine resin, polyimide resin, a polyamide resin, a cyanoacrylate resin, a phenolic resin, an unsaturated polyester resin, a melamine resin, a urea resin, a polyurethane resin, a polyisocyanate resin, a furan resin, a resorcinol resin, a xylene resin, a benzoguanamine resin, a diallyl phthalate resin, a silicone resin, a polyvinyl butyral resin, a siloxane-modified epoxy resin, a siloxane-modified polyamideimide resin, and an acrylate resin. These may be used alone or in combination of two or more. The resin composition forming the auxiliary member 3e may contain a hardener such as an imidazole-based hardener, a hardening accelerator, a flux compound, an inorganic filler, a conductive filler, and the like. The auxiliary member 3e is not limited to being formed of a film-like member, but may be formed of a paste-like non-conductive material (for example, Non Conductive Paste, NCP). The thermosetting resin composition forming the NCP may be the same as those described above. The auxiliary member 3e may be formed of a material having the same linear expansion coefficient as the material (cured product) forming the resin layer 3d. For example, the difference between the linear expansion coefficient of the cured resin layer 3d and the linear expansion coefficient of the cured auxiliary member 3e is preferably within 150 ppm/K. In addition, the auxiliary member 3e may have the same thickness as the resin layer 3d, or may be thicker or thinner than the resin layer 3d. The auxiliary member 3e may be formed of a light-transmitting material, and may have a transmittance of 10% or more and 100% or less. The transmittance can be obtained, for example, by setting a film (auxiliary member) cut into a 50 mm×50 mm square on the Haze Meter (for example, NDH-5000 manufactured by Nippon Denshoku Industries Co., Ltd.) and measuring the total light transmittance.

Next, an example of a method for manufacturing the semiconductor device 1 will be described with reference to FIGS. 2 to 5. FIGS. 2 to 5 are cross-sectional views sequentially showing a method for manufacturing the above-described semiconductor device 1. In this semiconductor device manufacturing method, first, as shown in (a) in FIG. 2, a temporary fixing layer 11 is formed on a carrier substrate 10. The carrier substrate 10 is, for example, a glass substrate. The temporary fixing layer 11 is, for example, a curable adhesive layer, and is configured to be peeled together with the carrier substrate 10 by light, heat, or the like in a step described later. After the temporary fixing layer 11 is formed, a wiring layer 12 is formed on the temporary fixing layer 11. The wiring layer 12 includes wiring electrodes 12a provided at its center, a plurality of connection electrodes 13, and an insulating portion 12b. The wiring layer 12 is, for example, a redistribution layer (RDL). Each wiring electrode 12a and each connection electrode 13 are formed of, for example, a copper pillar. The wiring electrode 12a is formed so that its front end 12d is exposed from a surface 12c of the insulating portion 12b. The connection electrode 13 is formed so that its upper half protrudes from the surface 12c of the insulating portion 12b. The wiring electrode 12a is an electrode connected to a lower end 23b of a through electrode 23 of a semiconductor die 20, which will be described later (see (b) in FIG. 2). The connection electrodes 13 are electrodes connected to semiconductor dies 26 and 27, which will be described later (see (b) in FIG. 3), and are formed on the outer side or outer peripheral side of the wiring layer 12 in the planar direction.

Then, as shown in (b) in FIG. 2 and FIG. 6, the semiconductor die 20 (semiconductor member) is prepared. The semiconductor die 20 includes a semiconductor substrate 21, a plurality of terminal electrodes 22, a plurality of through electrodes 23, a resin layer 24 (cured resin layer), and an auxiliary member 25. The semiconductor substrate 21 includes an upper surface 21a (first surface) and a lower surface 21b (second surface) on the opposite side. The plurality of terminal electrodes 22 are, for example, copper pillars provided on the upper surface 21a of the semiconductor substrate 21, and are connected to wirings (not shown) within the semiconductor substrate 21. The diameter of each terminal electrode 22 is, for example, 10 μm to 50 μm, the terminal pitch (separation distance) between the terminal electrodes 22 is, for example, 5 μm to 20 μm, and the height of each terminal electrode 22 is, for example, 20 μm to 50 μm. However, the size of the terminal electrodes 22 is not limited to these. The terminal pitch between the terminal electrodes 22 means the shortest separation distance between the outer circumferential surfaces of the terminal electrodes 22 adjacent to each other. The plurality of through electrodes 23 penetrate, for example, the semiconductor substrate 21, and have upper ends 23a (first ends) protruding from the upper surface 21a and lower ends 23b (second ends) protruding from the lower surface 21b. The diameter of the through electrode 23 (including the upper end 23a and the lower end 23b) is, for example, 10 μm to 50 μm. The separation distance between the upper end 23a of the through electrode 23 and the terminal electrode 22 adjacent thereto (as above, the shortest separation distance between the outer circumferential surfaces) is, for example, 5 μm to 20 μm, and the height of the upper end 23a protruding from the upper surface 21a is, for example, 20 μm to 50 μm. At this stage, the upper end 23a of the through electrode 23 may be buried in the resin layer 24 so as not to be exposed to the outside, but may be exposed. The lower end 23b of the through electrode 23 may be exposed to the outside.

The auxiliary member 25 is a member that extends in a planar direction so as to surround the periphery of a bonded portion between the lower end 23b of the through electrode 23 and the wiring electrode 12a of the wiring layer 12 so that the bonded portion is electrically insulated from other electrodes and that bonds and fixes the semiconductor die 20 to the wiring layer 12. The auxiliary member 25 is formed of, for example, NCF. The thermosetting resin composition forming the auxiliary member 25 contains, for example, a thermosetting resin having an electrical insulation property. Examples of the thermosetting resin include an epoxy resin, a bismaleimide resin, a triazine resin, polyimide resin, a polyamide resin, a cyanoacrylate resin, a phenolic resin, an unsaturated polyester resin, a melamine resin, a urea resin, a polyurethane resin, a polyisocyanate resin, a furan resin, a resorcinol resin, a xylene resin, a benzoguanamine resin, a diallyl phthalate resin, a silicone resin, a polyvinyl butyral resin, a siloxane-modified epoxy resin, a siloxane-modified polyamideimide resin, and an acrylate resin. These may be used alone or in combination of two or more. The resin composition forming the auxiliary member 25 may contain a hardener such as an imidazole-based hardener, a hardening accelerator, a flux compound, an inorganic filler, and the like. The auxiliary member 25 is not limited to being a film-like member, but may be a paste-like NCP. The auxiliary member 25 may be formed of a material having the same linear expansion coefficient as the material (cured product) forming the resin layer 24. For example, the difference between the linear expansion coefficient of the cured resin layer 24 and the linear expansion coefficient of the cured auxiliary member 25 is preferably within 150 ppm/K. The auxiliary member 25 may have the same thickness as the resin layer 24, or may be thicker or thinner than the resin layer 24. At this stage, the auxiliary member 25 is not cured, and is heat-cured in a step described later. The auxiliary member 25 may be formed from a light-transmitting material and may have a transmittance of 10% or more and 100% or less.

In the semiconductor die 20, the resin layer 24 is provided on the upper surface 21a of the semiconductor substrate 21 so as to cover the plurality of terminal electrodes 22 and the upper ends 23a of the plurality of through electrodes 23. Such a resin layer 24 can be formed, for example, by attaching a resin film formed of a thermosetting adhesive (curable resin composition) to the upper surface 21a of the semiconductor substrate 21 and then heat-curing the resin film. The resin layer 24 may be formed by using a DAF, for example. The resin layer 24 may be formed so as to cover the terminal electrodes 22 and the entire upper ends 23a of the through electrodes 23, or may be formed so that the front end of the terminal electrodes 22 and the upper end 23a of the through electrodes 23 are exposed from the surface 24a of the resin layer 24. The resin layer 24 may be formed by applying a liquid adhesive containing a thermosetting adhesive (curable resin composition) similar to the resin film to the upper surface 21a of the semiconductor substrate 21 and then curing the liquid adhesive. It is sufficient that the resin layer 24 is cured to such an extent that at least one of adsorption and application of a load (pressure), collet peeling after heat treatment, and polishing described later are possible. Therefore, the resin layer 24 may not be completely cured (so-called C stage). However, the resin layer 24 may be completely cured. The thickness of the resin layer 24 may be 50 μm or less, 20 μm or less, 10 μm or less, 9 μm or less, 8 μm or less, or 7 μm or less, or may be 1 μm or more, 2 μm or more, 3 μm or more, 4 μm or more, 5 μm or more, or 10 μm or more, for example. The thickness of the resin layer 24 may be between 50% and 150% or between 80% and 120% of the height of the plurality of terminal electrodes 22 or the height of the upper end 23a of the through electrode 23 (protruding height from the upper surface 21a of the semiconductor substrate 21), and it is preferable that the thickness of the resin layer 24 is similar to the height of the terminal electrodes 22 or the upper end 23a of the through electrode 23. The thickness of the resin layer 24 referred to herein means a thickness after curing, the height of the plurality of terminal electrodes 22 means the average height of the plurality of terminal electrodes 22, and the height of the upper ends 23a of the plurality of through electrodes 23 means the average height of the plurality of upper ends 23a. The thickness of the resin layer 24 may be between 50% and 150% or between 80% and 120% of the height of the plurality of terminal electrodes 22 or the upper end 23a, even after the resin layer 24 is polished in a step described below. In this case, the thickness of the resin layer 24 before polishing may be larger than the thickness of the auxiliary member 25.

The thermosetting adhesive forming this film contains, for example, a high molecular weight resin component and a thermosetting component. The high molecular weight resin component may contain, for example, at least one resin selected from the group including acrylic rubber, polyimide, and phenoxy resin. The high molecular weight resin component may have a reactive group such as an epoxy group. The weight average molecular weight of the high molecular weight resin component (standard polystyrene equivalent value measured by GPC method) may be 100000 to 3000000. The content of the high molecular weight resin component may be 30 to 80 parts by mass with respect to 10 parts by mass of the total mass of the resin layer 24.

The thermosetting component that can be contained in the resin layer 24 is a compound having a reactive group that forms a crosslinked structure by self-polymerization and/or reaction with a curing agent. The thermosetting component may contain, for example, at least one selected from the group including an epoxy resin, a bismaleimide resin, a triazine resin, and a phenol resin. The content of the thermosetting component may be 1 part by mass to 30 parts by mass with respect to 100 parts by mass of the resin layer 24. The thermosetting adhesive forming the resin layer 24 may contain other components as necessary. Examples of other components include a curing agent that reacts with the thermosetting component, a hardening accelerator that promotes the reaction between the thermosetting component and the curing agent, a coupling agent (for example, a silane coupling agent), and fillers (for example, silica).

The resin layer 24 may contain inorganic fillers. Specific examples of the inorganic fillers include glass, silica, alumina, titanium oxide, carbon black, mica, and boron nitride. Among these, silica, alumina, titanium oxide, and boron nitride are preferable from the viewpoint of handleability and processability (versatility), and silica, alumina, and boron nitride are more preferable from the viewpoint of dispersibility in resin and easy particle size control. These may be used alone or in combination of two or more. The inorganic fillers contained in the resin layer 24 may have an average particle size of, for example, 20 µm or less or may have an average particle size of 10 µm or less, and the inorganic fillers may have a maximum particle size of, for example, 30 µm or less. It is preferable that the inorganic fillers have an average particle size of 5 µm or less and a maximum particle size of 20 µm or less. Since the average particle size is 10 µm or less and the maximum particle size is 30 µm or less, it is possible to fill the space between terminals without a gap when forming the resin layer on the terminal surface, and it is possible to prevent warpage after the resin layer is cured. There are no particular limitations on the lower limit of the average particle size and the lower limit of the maximum particle size of the inorganic fillers, but both may be 0.001 µm or more. The aspect ratio of the inorganic fillers is preferably 50 to 85 from the viewpoint of improving thermal conductivity. The aspect ratio referred to herein is, for example, the average value of long diameter/short diameter that is the ratio of the long diameter and the short diameter in any 20 inorganic fillers.

An example of a method for measuring the average particle size and maximum particle size of inorganic fillers is a method of measuring the particle sizes of approximately 20 inorganic fillers using a scanning electron microscope (SEM). An example of a measurement method using the SEM is a method in which a resin composition containing inorganic fillers is heat-cured (preferably at 150° C. to 180° C. for 1 to 10 hours) to prepare a sample, a central portion of the sample is cut, and its cross section is observed by using the SEM. In this case, it is preferable that the probability of the presence of fillers having a particle size of 3 µm or less in the cross section is 80% or more of the total fillers.

The content of the inorganic fillers contained in the resin layer 24 may be 10% by mass to 95% by mass with the total amount of solids contained in the resin layer 24 before curing as a reference. The content of the inorganic fillers contained in the resin layer 24 is preferably 20% by mass or more, more preferably 30% by mass or more, particularly preferably 40% by mass or more, and preferably 40% by mass to 95% by mass, with the total amount of solids contained in the resin layer 24 (adhesive) before curing as a reference. The elastic modulus (Young's modulus) of such a resin layer 24 may be, for example, 10 MPa or more or 1.0 GPa or more at room temperature (25° C.). The linear expansion coefficient of the resin layer 24 at the glass transition temperature or lower may be, for example, 10 ppm/K to 200 ppm/K. The auxiliary member 25 may have the same configuration as the resin layer 24, and may contain inorganic fillers as described above. In this case, the auxiliary member 25 may have an elastic modulus of 10 MPa or more at room temperature, and may have a linear expansion coefficient of, for example, 10 ppm/K to 200 ppm/K. Preferably, the difference between the linear expansion coefficient of the resin layer 24 and the linear expansion coefficient of the auxiliary member 25 is within 150 ppm/K. The difference between the linear expansion coefficient of the resin layer 24 and the linear expansion coefficient of the auxiliary member 25 may be within 150 ppm/K even after the auxiliary member 25 is cured (that is, after the semiconductor device 1 is obtained). The thermal conductivity of the resin layer 24 is preferably 0.3 W/m·K or more, and more preferably 0.5 W/m·K or more.

It is preferable that the material forming the resin layer 24 has a reduced concentration of ionic impurities. Specifically, the ionic impurity concentration of the cured resin layer 24 is, for example, 5 ppm or less, may be 3 ppm or less, preferably 1 ppm or less, more preferably 0.5 ppm or less, and even more preferably 0.3 ppm or less. Therefore, since migration between a plurality of terminal electrodes 22 and migration between the upper end 23a of the through electrode 23 and the terminal electrodes 22 adjacent thereto, covered by the resin layer 24, are prevented, it is possible to ensure insulation between the terminal electrodes 22 and between the terminal electrode 22 and the upper end 23a in the resin layer 24. Since the resin layer 24 remains as a component of the manufactured semiconductor device 1 (and is not peeled during the manufacture), it is preferable that the resin layer 24 has such a migration prevention function. The ionic impurities referred to herein include sodium (Na), potassium (K), and chlorine (Cl). The material forming the auxiliary member 25 may similarly have a reduced concentration of ionic impurities, and the ionic impurity concentration of the auxiliary member 25 may be, for example, 5 ppm or less or 3 ppm or less.

Since the resin layer 24 remains as a component of the manufactured semiconductor device 1, it is preferable that the resin layer 24 is reliably fixed to the upper surface 21a of the semiconductor substrate 21 in a cured state. Specifically, the bonding strength between the cured resin layer 24 and the upper surface 21a of the semiconductor substrate 21 is 1 MPa or more, and preferably 3 MPa or more. The same is true for the auxiliary member 25, and the bonding strength between the auxiliary member 25 and the lower surface 21b of the semiconductor substrate 21 is 1 MPa or more, and preferably 3 MPa or more.

Then, after the preparation of the semiconductor die 20 having the above-described configuration ends, as shown in (a) and (b) in FIG. 6, the entire surface 24a of the resin layer 24 of the semiconductor die 20 is vacuum-adsorbed by a collet C for lift-up. The collet C is formed using, for example, a metal member having thermal conductivity, and is configured to transfer heat from a heat source (not shown) to the semiconductor die 20 (resin layer 24 and the like). That is, the collet C also functions as a heating element. Then, the semiconductor die 20 is moved to a predetermined position on the wiring layer 12 by the vacuum-adsorbed collet C, and is attached and fixed to the predetermined position on the wiring layer 12 by the auxiliary member 25. During this attachment, since the terminal electrodes 22 of the semiconductor die 20 are covered with the resin layer 24, the entire surface 24a of the resin layer 24 is heated and pressed with the collet C, so that it is possible to bond each lower end 23b of the plurality of through electrodes 23 to the corresponding wiring electrode 12a in the wiring layer 12. This results in the state shown in (b) in FIG. 2. The semiconductor die 20 is arranged face-up with the terminal electrodes 22 facing upward.

Then, as shown in (c) in FIG. 2, after the semiconductor die 20 is mounted (attached) on the wiring layer 12, an encapsulating layer 14 is formed on the wiring layer 12 by encapsulating the semiconductor die 20 and the connection electrodes 13 with an encapsulation. The encapsulating layer 14 is formed so as to include a thermosetting resin such as an epoxy resin, and is cured by heat or the like after encapsulating. By this heat curing, the auxiliary member 25 of the semiconductor die 20 may be cured. The encapsulation forming the encapsulating layer 14 contains a thermosetting resin composition, for example, an epoxy resin and a curing agent. The encapsulation forming the encapsulating layer 14 may further contain inorganic fillers, for example, silica fillers. The average particle size of the inorganic fillers contained in the encapsulation may be, for example, 50 μm or less, 25 μm or less, 10 μm or less, or 0.01 μm or less. In order to prevent warpage during or after the manufacture of the semiconductor device 1, the encapsulation forming the encapsulating layer 14 preferably contains inorganic fillers with a large particle size, and preferably contains inorganic fillers with an average particle size larger than the average particle size of the inorganic fillers contained in the resin layer 24 of the semiconductor die 20. When the terminal electrodes 22 and the upper ends 23a of the through electrodes 23 of the semiconductor die 20 are not covered with the resin layer 24, the spaces between the terminal electrodes 22 and between the terminal electrode 22 and the upper end 23a are encapsulated with the encapsulating layer 14. In this case, inorganic fillers having a particle size smaller than the space between the terminal electrodes 22 and the like is used for the encapsulating layer 14. When such a method is adopted, for example, the encapsulation resin tends to have low elasticity, which may make grinding in a subsequent grinding step difficult or cause warpage during or after the semiconductor device 1 is manufactured. However, if the terminal electrodes 22 and the upper ends 23a of the semiconductor die 20 are covered with the resin layer 24 as in the present embodiment, it is not necessary to consider the filling ability between the terminal electrodes 22 and the like when selecting a material as an encapsulation forming the encapsulating layer 14. Therefore, in the encapsulating layer 14, it is possible to design flexible resins and fillers taking into consideration warpage and the like.

After the encapsulating layer 14 is formed, as shown in (d) in FIG. 2, the encapsulating layer 14 is polished by CMP or the like. As a result, front ends 13a of the connection electrodes 13 are exposed outside an encapsulating layer 14a, and front ends 22a of the terminal electrodes 22 and upper ends 23a of the through electrodes 23 of the semiconductor die 20 are exposed outside from the surface 24a of the resin layer 24. In this manner, the encapsulating layer 14 is thinned to the encapsulating layer 14a shown in (d) in FIG. 2. The elastic modulus (Young's modulus) of such encapsulating layers 14 and 14a may be, for example, 3.0 GPa or more. The linear expansion coefficients of the encapsulating layers 14 and 14a may be 5 ppm/K to 150 ppm/K, and the difference from the linear expansion coefficient of the resin layer 24 may be 150 ppm/K or less, and preferably 100 ppm/K or less. The thickness of the polished resin layer 24 may be 20 μm or more. When the resin layer 24 is polished as described above, the front end portions of the terminal electrodes 22 and the upper ends of the through electrodes 23 may also be polished in the same manner.

After the encapsulating layer 14a is formed, as shown in (a) in FIG. 3, a wiring layer 15 is formed on the encapsulating layer 14a. The wiring layer 15 may be, for example, a redistribution layer (RDL). In the wiring layer 15, a plurality of connection electrodes 16 and a plurality of connection electrodes 17 are formed. A portion of the wiring layer 15 other than the electrodes is an insulating portion. The connection electrodes 16 connect an external device to the semiconductor dies 26 and 27, which will be described later, and are connected to the connection electrodes 13, for example. The connection electrodes 17 connect the semiconductor die 20 to the semiconductor dies 26 and 27, which will be described later. Each of the connection electrodes 17 is connected to the terminal electrode 22 of the semiconductor die 20. Some of the connection electrodes 17 connect the semiconductor dies 26 and 27 to the wiring electrodes 12a of the wiring layer 12 through the through electrodes 23 provided in the semiconductor die 20. In this case, each of the connection electrodes 17 is connected to the upper end 23a of the through electrodes 23 of the semiconductor die 20. Each of the connection electrodes 16 and each of the connection electrodes 17 includes, for example, a copper pillar. As a method for manufacturing the connection electrodes 16 and the connection electrodes 17, a known method can be used.

After the wiring layer 15 is formed, as shown in (b) in FIG. 3, the semiconductor dies 26 and 27 are mounted on the wiring layer 15. The semiconductor dies 26 and 27 are, for example, semiconductor chips such as an LSI chip, a CMOS sensor, and a memory. During this mounting, the connection electrodes 16 are connected to the semiconductor dies 26 and 27, and the connection electrodes 17 connect the semiconductor die 20 to the semiconductor dies 26 and 27. Some of the connection electrodes 17 connect the semiconductor dies 26 and 27 to the wiring electrodes of the wiring layer 12.

After the semiconductor dies 26 and 27 are mounted, as shown in (a) in FIG. 4, an encapsulating layer 18 is formed on the wiring layer 15 by encapsulating the semiconductor dies 26 and 27 with an encapsulation on the wiring layer 15. Similarly to the encapsulating layer 14, the encapsulating layer 18 contains a thermosetting resin such as an epoxy resin, and is cured after encapsulating.

After the encapsulating layer 18 is formed by encapsulating the semiconductor dies 26 and 27 with an encapsulation, as shown in (b) in FIG. 4, the semiconductor dies 26 and 27 may be ground until the surfaces of the semiconductor dies 26 and 27 are exposed from the surface of the encapsulating layer. As a result, the encapsulating layer 18 is thinned to an encapsulating layer 18a shown in (b) in FIG. 4.

After the encapsulating layer 18a is formed, as shown in (a) in FIG. 5, the carrier substrate 10 is peeled from the wiring layer 12 by irradiating the temporary fixing layer 11 with laser light or heating the temporary fixing layer 11 to reduce the adhesiveness of the temporary fixing layer 11.

After the carrier substrate 10 is peeled, as shown in (b) in FIG. 5, connection bumps 19 are formed on the lower ends of the connection electrodes 13 exposed from the lower surface of the wiring layer 12. A substrate 35 shown in (c) in FIG. 5 is prepared. A substrate body 36, connection bumps 37 for connecting wiring electrodes in the substrate body 36 to the outside, an adhesive member 38, and other members 39 (for example, various electronic components) are provided in the substrate 35.

Then, as shown in (c) in FIG. 5, a semiconductor device 30 provided with connection bumps 19 is mounted on the substrate 35. At this time, the semiconductor device 30 is fixed by being bonded by the adhesive member 38 on the substrate 35. Thereafter, the adhesive member 38 is cured by heat curing or the like, thereby manufacturing the semiconductor device 1 shown in FIG. 1.

Next, an example of a method for manufacturing the semiconductor die 20 used in manufacturing the above-described semiconductor device 1 will be described with reference to FIG. 7.

First, as shown in (a) in FIG. 7, a semiconductor wafer 41 corresponding to each semiconductor substrate 21 of a plurality of semiconductor dies 20 is prepared. The semiconductor wafer 41 has a plurality of electrodes 42 and a plurality of through electrodes 43 corresponding to each semiconductor die 20. After the semiconductor wafer 41 is prepared, as shown in (b) in FIG. 7, a wafer resin layer 44 containing a curable resin composition is formed on an upper surface 41a (first surface) of the semiconductor wafer 41 so as to cover the plurality of electrodes 42 and each upper end 43a of the plurality of through electrodes 43. The wafer resin layer 44 corresponds to the above-described resin layer 24 (before curing), and is formed by attaching a resin film containing a similar thermosetting resin composition to the semiconductor wafer 41. The wafer resin layer 44 may also be formed by applying a liquid adhesive containing a similar thermosetting resin composition to the semiconductor wafer 41. Thereafter, as shown in (c) in FIG. 7, the wafer resin layer 44 is cured by heat or the like to form a cured wafer resin layer 44a.

Then, as shown in (d) in FIG. 7, an NCF 45 corresponding to the above-described auxiliary member 25 is attached to a lower surface 41b (second surface) of the semiconductor wafer 41. This ensures the insulation of each lower end 43b of the plurality of through electrodes 43. Then, as shown in (e) in FIG. 7, the semiconductor wafer 41 including the cured wafer resin layer 44a is singulated into individual pieces by dicing D to obtain a plurality of semiconductor dies 20. Such a semiconductor die 20 can be used as a bridge die when manufacturing various semiconductor devices. The semiconductor device shown in FIG. 1 is an example using the semiconductor die 20, and is not limited to this.

Here, the function and effect of the method for manufacturing the semiconductor device according to the present embodiment, specifically, the method for mounting the semiconductor die 20, will be described in comparison with a method shown in FIG. 9. In the method shown in FIG. 9, since the resin layer 24 is not provided unlike in the method according to the present embodiment, a plurality of terminal electrodes 122 and upper ends 123a (copper pillar) of through electrodes 123 on a semiconductor substrate 121 are exposed. For this reason, as shown in (a) in FIG. 9, adsorption is performed using a metal collet C1 whose outer periphery protrudes (center is recessed) so as to avoid the terminal electrodes 122 and the upper ends 123a of the through electrodes 123. As semiconductor dies are becoming thinner, when such suction is performed, the outer periphery of the semiconductor die 120 may be strongly sucked, causing the semiconductor die 120 to bend. In particular, when a semiconductor wafer is singulated into individual pieces to obtain a plurality of semiconductor dies 120, the semiconductor die 120 is pushed up from the back side by a pin P or the like when peeled from the dicing tape, but this may accelerates the bending of the semiconductor die 120, or in some cases, the semiconductor die 120 may crack.

In addition, as shown in (b) in FIG. 9, when the semiconductor die 120 is mounted on the support 110 (wiring layer) and thermo-compressed after suction, heat and load are applied only to the outer periphery (see two regions R in the drawing). This makes it difficult for heat to be transferred to bonded portions between the lower ends 123b of the through electrodes 123 and the wiring electrodes of the wiring layer (support 110), and makes it difficult to apply pressure firmly to the bonded portions. In addition, it becomes difficult to apply a load to the central portion of the back surface of the semiconductor die 120, which may result in insufficient compression or formation of a gap in the central portion.

In contrast, in the method for manufacturing a semiconductor device according to the present embodiment, as shown in FIG. 6, when mounting the semiconductor die 20, the cured resin layer 24 is provided on the upper surface 21a of the semiconductor substrate 21 so as to cover the plurality of terminal electrodes 22 and the upper ends 23a of the through electrodes 23. Then, the surface 24a of the cured resin layer 24 is adsorbed by the collet C for lift-up, and subsequent mounting is performed. Thus, since the plurality of terminal electrodes 22 and the upper ends 23a of the through electrodes 23 are covered with the resin layer 24, the semiconductor die 20 is lifted up by suction using the collet C, which is a holding member, without avoiding the terminal electrodes 22 and the upper ends 23a of the through electrodes 23. As a result, bending or cracking of the semiconductor die can be prevented.

Further, in this method for manufacturing a semiconductor device, the cured resin layer 24 is provided on the upper surface 21a of the semiconductor substrate 21 so as to cover the terminal electrodes 22 and the upper ends 23a of the through electrodes 23. Then, the metal collet C, which is a heating element, is brought into contact with the surface 24a of the cured resin layer 24 to heat-bond (thermo-compress) the lower ends 23b of the through electrodes 23 to the wiring electrodes 12a of the wiring layer 12, which is a support. In this case, since the terminal electrodes 22 and the upper ends 23a of the through electrodes 23 are covered with the resin layer 24, the entire surface of the semiconductor die 20 can be heated by the collet C, which is a heating element, without avoiding the terminal electrodes 22 and the like. Therefore, heat from the collet C can be sufficiently transferred to the semiconductor die 20 and the through electrodes 23 located thereinside. In addition, since a load can be applied to the entire surface of the semiconductor die 20 by providing such a resin layer 24, the bonding pressure of the through electrodes 23 to the wiring electrodes 12a of the wiring layer 12 can be sufficiently secured. As described above, according to this method for manufacturing a semiconductor device, it is possible to reliably bond the through electrodes 23 of the semiconductor die 20 having a plurality of terminal electrodes 22. In addition, in this method for manufacturing a semiconductor device, since a portion covering the terminal electrodes 22 and the like is formed from the cured resin layer 24, the manufacturing process is easy.

In the method for manufacturing a semiconductor device according to the present embodiment, when preparing the semiconductor die 20, a resin layer containing a curable resin composition is formed on the upper surface 21a of the semiconductor substrate 21 so as to cover the plurality of terminal electrodes 22 and the upper ends 23a of the through electrodes 23, and this resin layer is cured to form a cured resin layer. In this manner, it is possible to easily form the resin layer 24 that protects the plurality of terminal electrodes 22 and the upper ends 23a of the through electrodes 23.

In the method for manufacturing a semiconductor device according to the present embodiment, the cured resin layer 24 is formed by attaching a resin film (for example, DAF) containing a curable resin composition to the upper surface 21a of the semiconductor substrate 21 and then curing the resin film. In this manner, it is possible to easily form the resin layer 24 that protects the plurality of terminal electrodes 22 and the upper ends 23a of the through electrodes 23. Alternatively, the cured resin layer 24 may be formed by applying a liquid adhesive containing a curable resin composition to the upper surface 21a of the semiconductor substrate 21 and then curing the liquid adhesive. In this case as well, it is possible to easily form the resin layer 24 that protects the plurality of terminal electrodes 22 and the upper ends 23a of the through electrodes 23.

In the method for manufacturing a semiconductor device according to the present embodiment, it is preferable that the cured resin layer 24 contains inorganic fillers. In this case, since the hardness (elastic modulus and the like) of the resin layer 24 can be improved, bending and cracking of the semiconductor die 20 can be further prevented. In addition, since the inorganic fillers are contained, it is also possible to prevent the warpage of the semiconductor die 20 including the resin layer 24. Further, since the inorganic fillers are contained, the polishing process becomes easier when polishing the resin layer 24.

In the method for manufacturing a semiconductor device according to the present embodiment, the content of the inorganic fillers in the cured resin layer 24 may be 10% by mass or more with the total amount of solids contained in the resin layer before curing as a reference. In this case, the warpage of the semiconductor die 20 can be more reliably prevented.

In the method for manufacturing a semiconductor device according to the present embodiment, the average particle size of the inorganic fillers in the cured resin layer 24 is preferably 20 μm or less. In this case, even if the terminal electrodes 22 of the semiconductor die 20 and the pitch therebetween are small, the resin and fillers can be reliably inserted between the terminal electrodes. Therefore, the terminal electrodes can be reliably covered with the resin layer.

In the method for manufacturing a semiconductor device according to the present embodiment, the elastic modulus of the cured resin layer 24 may be 10 MPa or more. In this case, bending and cracking of the semiconductor die 20 can be further prevented. In addition, when the cured resin layer 24 is polished to expose the heads of the terminal electrodes 22, the polishing work can be easily performed. In addition, since the cured resin layer 24 has a high elastic modulus, the resin layer, the copper pattern, and the like can be easily ground.

In the method for manufacturing a semiconductor device according to the present embodiment, when preparing the semiconductor die 20, the semiconductor wafer 41 corresponding to a plurality of semiconductor substrates 21 is prepared, and then the wafer resin layer 44 containing a curable resin composition is formed on the upper surface 41a of the semiconductor wafer 41 so as to cover the plurality of electrodes 42 and each upper end 43a of the plurality of through electrodes 43. Then, the wafer resin layer 44 is cured. Thereafter, the semiconductor wafer 41 is singulated into individual pieces by the dicing D to obtain a plurality of semiconductor dies 20. According to this method, a plurality of semiconductor dies 20 can be manufactured collectively. In addition, according to this manufacturing method, even when the semiconductor wafer 41 singulated into individual pieces by dicing, the semiconductor dies 20 can be peeled from the dicing tape without bending or cracking.

In the method for manufacturing a semiconductor device according to the present embodiment, after the lower ends 23b of the through electrodes 23 are bonded to the wiring electrodes 12a of the wiring layer 12 that is a support, the semiconductor die 20 may be encapsulated with the encapsulation to form the encapsulating layers 14 and 14a on the wiring layer 12. The average particle size of the inorganic fillers contained in the encapsulating layers 14 and 14a is preferably larger than the average particle size of the inorganic fillers contained in the resin layer 24. Since the encapsulation contains large inorganic fillers, the warpage of the encapsulating layer 14 due to heat can be more reliably prevented. Particularly in the large-format process, reliable adsorption becomes possible during high-precision processing in subsequent steps.

In the method for manufacturing a semiconductor device according to the present embodiment, the difference between the linear expansion coefficient of the encapsulating layers 14 and 14a and the linear expansion coefficient of the cured resin layer 24 is preferably within 150 ppm/K. In this case, since the behavior of the encapsulating layer 14a and the resin layer 24 becomes uniform when heat is applied to the manufactured semiconductor device 1, the occurrence of problems due to heat, such as misalignment due to expansion, can be reduced.

In the method for manufacturing a semiconductor device according to the present embodiment, the cured resin layer 24 may be polished together with the encapsulating layer 14a so that the front ends 22a of the plurality of terminal electrodes 22 and the upper ends 23a of the plurality of through electrodes 23 are exposed from the cured resin layer 24. In this manner, it is possible to accurately form the fine wiring layer 15 and the like on the surface of the polished encapsulating layer 14 and the like.

In the method for manufacturing a semiconductor device according to the present embodiment, the thickness of the cured resin layer 24 may be 15 μm or more, or 30 μm or more when the semiconductor die 20 is lifted up by the collet C or when the semiconductor die 20 is heat-bonded. In this case, bending and cracking of the semiconductor die 20 can be more reliably prevented.

In the method for manufacturing a semiconductor device according to the present embodiment, the auxiliary member 25 of the insulating layer to attach the semiconductor die 20 to a support, such as the wiring layer 12, may be provided on the lower surface 21b of the semiconductor substrate 21. The auxiliary member 25 may surround the lower ends 23b of the through electrodes 23. In this case, the through electrodes 23 of the semiconductor die 20 can be more reliably bonded to the wiring electrodes 12a of the wiring layer 12, which is a support, while ensuring insulation from other electrodes. In addition, the semiconductor member can be easily attached to the support.

In the method for manufacturing a semiconductor device according to the present embodiment, the difference between the linear expansion coefficient of the cured resin layer 24 and the linear expansion coefficient of the auxiliary member 25 may be within 150 ppm/K. In this case, since the thermal expansions of the cured resin layer and the auxiliary member interposing the semiconductor substrate therebetween are approximately the same, it is possible to prevent the position or parallelism of the semiconductor substrate from being adversely affected and to prevent the warpage of the mounted chip.

In the method for manufacturing a semiconductor device according to the present embodiment, the thickness of the cured resin layer 24 may be between 50% and 150%, or may be between 80% and 120%, of the height of the terminal electrode 22. In this case, since the thickness of the resin layer 24 and the height of the terminal electrode 22 are approximately the same, the semiconductor die 3 can be lifted up and attached more reliably.

In the method for manufacturing a semiconductor device according to the present embodiment, when the collet C is adsorbed to the entire surface 24a of the cured resin layer 24 and lifted up to perform heat-bonding, the collet C that is a holding member functions as a heating element, and the collet C is brought into contact with and pressed against the entire surface 24a of the cured resin layer 24 to perform heat-bonding. In this manner, bending or cracking of the semiconductor die 20 can be more reliably prevented, and the through electrodes 23 of the semiconductor die 20 can be more reliably bonded to the wiring electrodes 12a of the wiring layer 12. In addition, the semiconductor die 20 can be more reliably attached to the wiring electrode 12a that is a support.

In the method for manufacturing a semiconductor device according to the present embodiment, the ionic impurity concentration of the cured resin layer 24 is 5 ppm or less (or 3 ppm or less). Therefore, it is possible to prevent migration between the plurality of terminal electrodes 22 and migration between the terminal electrode 22 and the upper end 23a of the through electrode 23, which are covered with the cured resin layer 24.

In the method for manufacturing a semiconductor device according to the present embodiment, the bonding strength between the cured resin layer 24 and the upper surface 21a of the semiconductor substrate 21 is 1 MPa or more. Therefore, in the manufactured semiconductor device 1, the resin layer 24 of the semiconductor die 20 is prevented from peeling.

While the embodiment of the present disclosure has been described above, the present invention is not limited to the above-described embodiment, and may be appropriately changed without departing from the spirit of the present invention. For example, in the above-described embodiment, the semiconductor die 20 used includes the auxiliary member 25 as shown in FIG. 6, but the present invention is not limited thereto. For example, as shown in FIG. 8, a semiconductor die 20A that does not have the auxiliary member 25 may be used. In this case, when mounting the semiconductor die 20A on the wiring layer 12, the lower ends 23b of the through electrodes 23 may be heat-bonded to the wiring electrodes 12a of the wiring layer 12 using the method described above, and then an underfill may be filled between the wiring electrodes 12a and the lower surface of the semiconductor die 20. Such bonding may be performed by using solder. In this case, flux may be removed after the bonding.

REFERENCE SIGNS LIST

1: semiconductor device, 3: semiconductor die (semiconductor member), 3a: semiconductor substrate, 3b: terminal electrode, 3c: through electrode, 3d: resin layer, 5a: wiring layer (support), 12: wiring layer (support), 12a: wiring electrode, 14, 14a: encapsulating layer, 20, 20A: semiconductor die (semiconductor member), 21: semiconductor substrate, 21a: upper surface (first surface), 21b: lower surface (second surface), 22: terminal electrode, 22a: front end, 23: through electrode, 23a: upper end (first end), 23b: lower end (second end), 24: resin layer, 25: auxiliary member, 41: semiconductor wafer, 41a: upper surface (first surface), 41b: lower surface (second surface), 42: electrode, 43: through electrode, 43a: upper end (first end), 43b: lower end (second end), 44, 44a: wafer resin layer, 45: NCF.

The invention claimed is:

1. A method for manufacturing a semiconductor device, comprising:

preparing a semiconductor member including a semiconductor substrate having a first surface and a second surface on an opposite side, a plurality of terminal electrodes provided on the first surface of the semiconductor substrate, a through electrode that penetrates the semiconductor substrate and has a first end protruding from the first surface and a second end protruding from the second surface, and a cured resin layer provided on the first surface so as to cover the plurality of terminal electrodes and the first end of the through electrode;

preparing a support including at least one wiring electrode;

arranging the semiconductor member on the support so that the second end of the through electrode of the semiconductor member corresponds to the wiring electrode of the support; and heat-bonding the second end of the through electrode and the wiring electrode of the support to each other by pressing a surface of the cured resin layer of the semiconductor member while making a heating element in contact with the surface of the cured resin layer.

2. The method for manufacturing a semiconductor device according to claim 1, wherein the preparing the semiconductor member includes:

forming a resin layer including a curable resin composition on the first surface of the semiconductor substrate so as to cover the plurality of terminal electrodes and the first end of the through electrode; and curing the resin layer to obtain the cured resin layer.

3. The method for manufacturing a semiconductor device according to claim 1,
wherein the cured resin layer is formed by attaching a resin film including a curable resin composition to the first surface of the semiconductor substrate and then curing the resin film.

4. The method for manufacturing a semiconductor device according to claim 1,
wherein the cured resin layer is formed by applying a liquid adhesive including a curable resin composition to the first surface of the semiconductor substrate and then curing the liquid adhesive.

5. The method for manufacturing a semiconductor device according to claim 1,
wherein the cured resin layer includes inorganic fillers.

6. The method for manufacturing a semiconductor device according to claim 5,
wherein a content of the inorganic fillers is 30% by mass or more with a total amount of solids included in a resin layer before curing as a reference.

7. The method for manufacturing a semiconductor device according to claim 5,
wherein an average particle size of the inorganic fillers is 20 µm or less.

8. The method for manufacturing a semiconductor device according to claim 1,
wherein an elastic modulus of the cured resin layer at room temperature is 10 MPa or more.

9. The method for manufacturing a semiconductor device according to claim 1,
wherein the preparing the semiconductor member includes:
preparing a semiconductor wafer including the semiconductor substrate, a plurality of through electrodes including the through electrode being provided in the semiconductor wafer and a plurality of electrodes including the plurality of terminal electrodes and each first end of the plurality of through electrodes being provided on a first surface of the semiconductor wafer;
forming a wafer resin layer including a curable resin composition on the first surface of the semiconductor wafer so as to cover the plurality of electrodes and each first end of the plurality of through electrodes;
curing the wafer resin layer; and
singulating the semiconductor wafer into individual pieces by dicing to obtain the semiconductor member.

10. The method for manufacturing a semiconductor device according to claim 1, further comprising:
forming an encapsulating layer on the support by encapsulating the semiconductor member with an encapsulation after the second end of the through electrode is bonded to the wiring electrode of the support.

11. The method for manufacturing a semiconductor device according to claim 10,
wherein an average particle size of inorganic fillers included in the encapsulating layer is larger than an average particle size of inorganic fillers included in the cured resin layer.

12. The method for manufacturing a semiconductor device according to claim 10,
wherein a difference between a linear expansion coefficient of the encapsulating layer and a linear expansion coefficient of the cured resin layer is within 150 ppm/K.

13. The method for manufacturing a semiconductor device according to claim 10, further comprising:
polishing the cured resin layer together with the encapsulating layer so that a front end of each of the plurality of terminal electrodes and the first end of the through electrode are exposed from the cured resin layer.

14. The method for manufacturing a semiconductor device according to claim 1,
wherein a thickness of the cured resin layer is 30 µm or more in the arranging the semiconductor member.

15. The method for manufacturing a semiconductor device according to claim 1,
wherein a thermal conductivity of the cured resin layer is 0.3 W/m·K or more.

16. The method for manufacturing a semiconductor device according to claim 1,
wherein an insulating auxiliary member to attach the semiconductor member to the support is provided on the second surface of the semiconductor substrate, and the auxiliary member surrounds the second end of the through electrode.

17. The method for manufacturing a semiconductor device according to claim 16,
wherein the auxiliary member is provided on the second surface of the semiconductor member before the semiconductor member is arranged on the support.

18. The method for manufacturing a semiconductor device according to claim 16,
wherein a difference between a linear expansion coefficient of the cured resin layer and a linear expansion coefficient of the auxiliary member is within 150 ppm/K.

19. The method for manufacturing a semiconductor device according to claim 16,
wherein the auxiliary member is a non-conductive adhesive film.

20. The method for manufacturing a semiconductor device according to claim 16,
wherein a transmittance of the auxiliary member is 10% or more.

21. The method for manufacturing a semiconductor device according to claim 1,
wherein a thickness of the cured resin layer is between 50% and 150% of a height of the plurality of terminal electrodes.

22. The method for manufacturing a semiconductor device according to claim 1,
wherein, in the arranging the semiconductor member, a holding member is adsorbed to the entire surface of the cured resin layer and lifted up, and
in the heat-bonding, the holding member is made to function as the heating element, and the holding member is brought into contact with and pressed against the entire surface of the cured resin layer to perform heat-bonding.

23. The method for manufacturing a semiconductor device according to claim 1,
wherein the cured resin layer has an ionic impurity concentration of 5 ppm or less.

24. The method for manufacturing a semiconductor device according to claim 1,
wherein a bonding strength between the cured resin layer and the first surface of the semiconductor substrate is 1 MPa or more.

25. The method for manufacturing a semiconductor device according to claim 1,
   wherein a bonding strength between the cured resin layer and the first surface of the semiconductor substrate is 3 MPa or more.

26. The method for manufacturing a semiconductor device according to claim 1, further comprising:
   mounting a first semiconductor die and a second semiconductor die on the first surface side of the semiconductor member after the semiconductor member is attached to the support,
   wherein, in the mounting, the first semiconductor die and the second semiconductor die are connected to each other by the semiconductor member.

* * * * *